United States Patent
Barnola et al.

(10) Patent No.: US 9,240,325 B2
(45) Date of Patent: Jan. 19, 2016

(54) METHOD FOR MAKING AN INTEGRATED CIRCUIT

(71) Applicants: COMMISSARIAT A L'ENERGIE ATOMIQUE ET AUX ENERGIES ALTERNATIVES, Paris (FR); STMICROELECTRONICS SA, Montrouge (FR); STMICROELECTRONICS (Crolles 2) SAS, Crolles (FR)

(72) Inventors: Sébastien Barnola, Villard-Bonnot (FR); Yves Morand, Grenoble (FR); Heimanu Niebojewski, Papeete (FR)

(73) Assignees: STMICROELECTRONICS SA, Montrouge (FR); STMICROELECTRONICS (CROLLES 2) SAS, Crolles (FR); COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/498,091

(22) Filed: Sep. 26, 2014

(65) Prior Publication Data

US 2015/0091106 A1     Apr. 2, 2015

(30) Foreign Application Priority Data

Sep. 27, 2013  (FR) ..................... 13 59365

(51) Int. Cl.
 *H01L 29/423* (2006.01)
 *H01L 29/78* (2006.01)
 (Continued)

(52) U.S. Cl.
 CPC ........ *H01L 21/28008* (2013.01); *H01L 21/283* (2013.01); *H01L 21/28052* (2013.01);
 (Continued)

(58) Field of Classification Search
 None
 See application file for complete search history.

(56) References Cited

U.S. PATENT DOCUMENTS

| 5,686,329 A | 11/1997 | Chang | |
|---|---|---|---|
| 2005/0095793 A1* | 5/2005 | Lee | ................... H01L 29/41791 438/294 |

(Continued)

FOREIGN PATENT DOCUMENTS

WO   2011/090571   7/2011

OTHER PUBLICATIONS

Search Report and Written Opinion issued for French Patent Application No. 1359365, dated Mar. 13, 2014.
(Continued)

*Primary Examiner* — Hoai V Pham
*Assistant Examiner* — Long Le
(74) *Attorney, Agent, or Firm* — Pillsbury Winthrop Shaw Pittman LLP

(57) ABSTRACT

A method includes making a gate stack on the surface of an active zone, including depositing a first dielectric layer; depositing a gate conductive layer; depositing a first metal layer; depositing a second metal layer; depositing a second dielectric layer; partially etching the gate stack for the formation of a gate zone on the active zone; making insulating spacers on either side of the gate zone on the active zone; making source and drain electrodes zones; making silicidation zones on the surface of the source and drain zones; etching, in the gate zone on the active zone, the second dielectric layer and the second metal layer with stopping on the first metal layer, so as to form a cavity between the insulating spacers; making a protective plug at the surface of the first metal layer of the gate zone on the active zone, where the protective plug fills the cavity.

15 Claims, 25 Drawing Sheets

(51) Int. Cl.
  *H01L 21/283* (2006.01)
  *H01L 29/66* (2006.01)
  *H01L 21/28* (2006.01)
  *H01L 29/49* (2006.01)

(52) U.S. Cl.
  CPC .... *H01L21/28123* (2013.01); *H01L 29/42372* (2013.01); *H01L 29/49* (2013.01); *H01L 29/4933* (2013.01); *H01L 29/4975* (2013.01); *H01L 29/6653* (2013.01); *H01L 29/66507* (2013.01); *H01L 29/66545* (2013.01); *H01L 29/78* (2013.01)

(56) References Cited

U.S. PATENT DOCUMENTS

| | | |
|---|---|---|
| 2005/0095797 A1 | 5/2005 | Cho |
| 2007/0026578 A1 | 2/2007 | Kim |
| 2007/0296052 A1* | 12/2007 | Lee ............... H01L 29/66507 257/478 |
| 2008/0224235 A1 | 9/2008 | Lavoie |
| 2008/0224325 A1* | 9/2008 | Nishimura ............ H01L 21/563 257/778 |

OTHER PUBLICATIONS

E.P. Gusev et al., "Advanced high-$k$ dielectric stacks with polySi and metal gates: Recent progress and current challenges", IBM Journal of Research and Development, Jul./Sep. 2006, pp. 387-410, XP55106143.

* cited by examiner

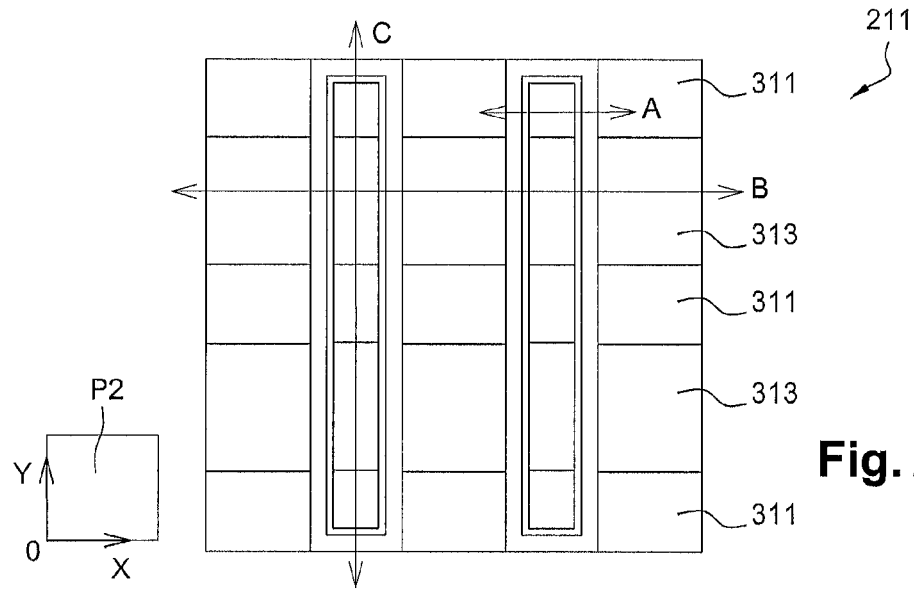
Fig. 24a
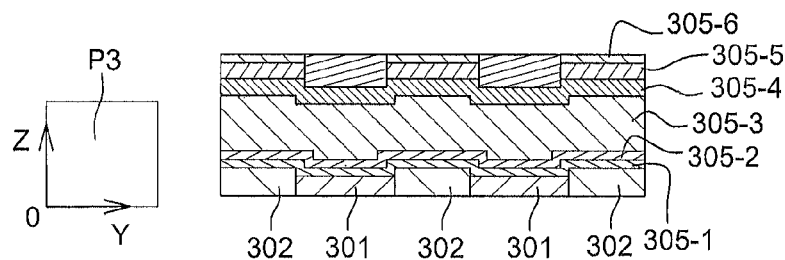
Fig. 24b
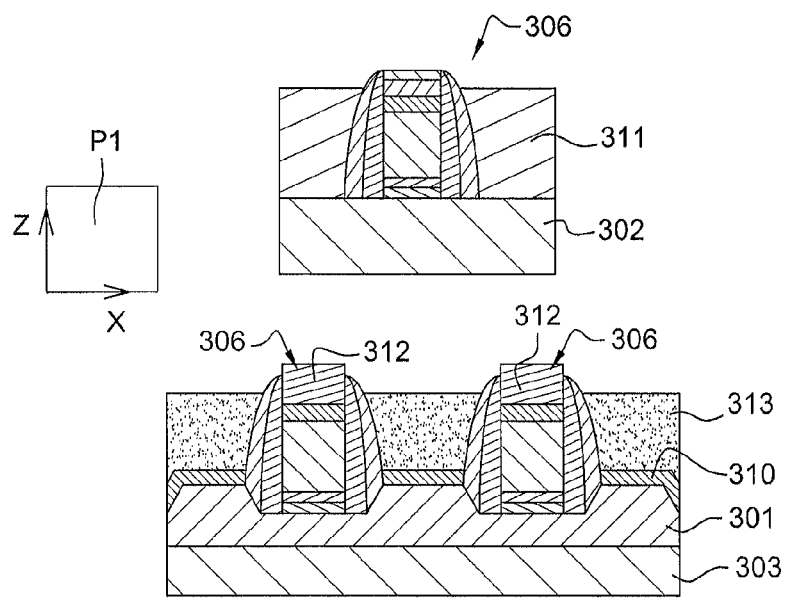
Fig. 24c
Fig. 24d

METHOD FOR MAKING AN INTEGRATED CIRCUIT

CROSS-REFERENCE TO RELATED APPLICATIONS

This application claims priority to French Patent Application No. 1359365, filed Sep. 27 2013, the entire content of which is incorporated herein by reference in its entirety.

FIELD

The technical field of the invention is that of methods for making integrated circuits. The present invention relates to a method for making a transistor and in particular a method for making a transistor with self-aligned contacts using a "gate-first" approach.

BACKGROUND

SOI ("silicon on insulator") technology is a beneficial alternative when compared with the "bulk silicon" approach, in particular for high-frequency component manufacturing, of transistors, for example.

There are simultaneous trends in integrated circuits towards a constant reduction in the dimensions of integrated circuits and towards an increase in the density of the latter. The reduction in the dimensions of integrated circuits is accompanied by level-to-level alignment specifications that are increasingly difficult to achieve. In particular the ability to align contacts relative to gates within an advanced transistor architecture is desired. In this context a technique for the self-alignment of contacts relative to gates is beneficially implemented.

There is a method known in the state of the art for making integrated circuits with self-aligned contacts using a "gate-last" approach, as described in document WO 2011/090571 A2. A method for making a transistor with a "gate-last" type approach comprises a step for making a gate zone within a sacrificial stack, then a step for replacing the sacrificial stack with the final gate stack. Another possible approach is the "gate-first" approach. In the case of a "gate-first" approach, a gate zone is made directly in a gate stack, which will make up the gate zone in the final integrated circuit. A "gate-first" approach does not require the use of sacrificial materials and is therefore beneficially less costly to implement than a "gate-last" approach. Moreover, SOI technology favours "gate-first" type approaches in the manufacture of components, since the specifications in terms of threshold voltage are slightly less restrictive than in "bulk" type approaches.

A method 100 for making MOSFET transistors with self-aligned contacts in a "gate-first" approach in accordance with the state of the art is described, for example, in FIGS. 1 to 12. FIGS. 1 to 12 are described jointly.

A first step 101 in the method 100 is shown in sectional view in FIG. 1a and in a top view in FIG. 1b. The sectional view is along a first plane P1 with centre O and orthogonal axes X and Z; the top view is along a second plane P2 of centre O and orthogonal axes X and Y. The second plane P2 is perpendicular to the first plane P1. According to the first step 101, a start is made from a substrate 10 of the SOI type which incorporates shallow trench insulation (STI). The substrate 10 comprises a first layer 11 of Si, on which an insulating layer 12 of SiO2 extends, also known as Box ("buried oxide"). The insulating layer 12 has a thickness measured along the Z axis which is typically less than or equal to 25 nm. A thin layer 13 of Si extends over the insulating layer 12. The thin layer 13 of Si has a thickness measured along the Z axis which is typically less than 5 nm. The thin layer 13 of Si forms an active zone. The substrate 10 incorporates STI insulation zones 14. The substrate 10 thus has alternating insulation zones 14 and active zones 13.

A second step 102 of the method 100 is illustrated as a sectional view in FIG. 2. The sectional view is along the first plane P1.

According to a second step 102, a gate stack 15 is deposited on the substrate 10. The gate stack 15 can typically comprise;
- a first layer 15-1 of a high-k dielectric, with the first layer 15-1 extending over the substrate 10;
- a second layer 15-2 of titanium nitride, with the second layer 15-2 extending over the first layer 15-1;
- a third layer 15-3 of polysilicon, with the third layer 15-3 extending over the second layer 15-2;
- a fourth layer 15-4 of a dielectric, for example a nitride, with the fourth layer 15-4 extending over the third layer 15-3;

A third step 103 in the method 100 is shown in sectional view in FIG. 3a and in a top view in FIG. 3b. The sectional view is along the first plane P1 and the top view is along the second plane P2.

According to the third step 103, gate zones 16 are defined in the gate stack 15, for example using lithography and anisotropic etching of the gate stack 15. Each gate zone 16 has, in the example shown, a width of 14 nm measured along the X axis. The separation distance along the X axis between two consecutive gate zones 16 is 64 nm in the example shown.

First insulating spacers 17 are then made around each gate zone 16.

A fourth step 104 in the method 100 is shown in sectional view in FIG. 4a and in a top view in FIG. 4b. The sectional view is along the first plane P1 and the top view is along the second plane P2. According to the fourth step 104, a start is made by using a first mask M1 to protect a region which is later intended to form pMOS transistors in the example shown. Then first drain and source zones 18 are made which are n-type in the example shown. The first mask M1 is removed at the end of the third step 103.

A fifth step 105 in the method 100 is shown in sectional view in FIG. 5a and in a top view in FIG. 5b. The sectional view is along the first plane P1 and the top view is along the second plane P2. According to the fifth step 105, a start is made by using a second mask M2 to protect a region which is later intended to form nMOS transistors in the example shown. Then second drain and source zones 19 are made which are p-type. The second mask M2 is removed at the end of the fifth step 105.

A sixth step 106 in the method 100 is shown in sectional view in FIG. 6a and in a top view in FIG. 6b. The sectional view is along the first plane P1 and the top view is along the second plane P2. According to the sixth step 106, second insulating spacers 20 are made around the first insulating spacers 17. The second insulating spacers 20 are made from a dielectric material, for example a nitride. Other spacers in contact with the second spacers could also be made.

A seventh step 107 of the method 100 is shown in sectional view in FIG. 7. The sectional view is along the first plane P1. According to the seventh step 107, the fourth layer 15-4 of dielectric, located at the top of each gate zone 16, is removed thus exposing the third layer 15-3 of polysilicon. A layer 21 of a material which is suitable for silicidation using, for example, a layer of nickel Ni, is then deposited on the surface of the device, covering in particular each third layer 15-3 of gate zones 16 as well as the first source and drain zones 18 and the second source and drain zones 19.

An eighth step 108 in the method 100 is shown in sectional view in FIG. 8a and in a top view in FIG. 8b. The sectional view is along the first plane P1 and the top view is along the second plane P2. According to the eighth step 108, heat treatment is carried out so as to cause, starting from layer 21, the formation of zones 22 of silicide at the surface of each third layer 15-3 of the gate zones 16 as well as the first drain and source zones 18 and the second drain and source zones 19. The residual material of the layer 21 is then removed by etching which is selective in relation to the material of the second spacers 20.

A ninth step 109 of the method 100 is shown in sectional view in FIG. 9. The sectional view is along the first plane P1. According to the ninth step 109, the deposition of a layer 23 of a pre-metal dielectric (PMD) material is carried out at the surface of the entire device. Then a polishing step 23 of the PMD dielectric material is carried out, for example using a chemical-mechanical polishing step (CMP).

A tenth step 110 of the method 100 is shown in sectional view in FIG. 10. The sectional view is along the first plane P1. According to the tenth step 110, a third mask M3 is deposited on the layer 23 of the PMD dielectric material. The third mask M3 may be, for example, a layer of resin. A lithography step is then carried out on the third mask M3 in order to define the zones to be etched in the PMD dielectric material. At the end of this lithography step the third mask M3 is preserved above the insulation zones 14 and therefore protects the insulation zones 14.

An eleventh step 111 of the method 100 is shown in sectional view in FIG. 11a and in a top view in FIG. 11b. The sectional view is along the first plane P1 and the top view is along the second plane P2. According to the eleventh step 111, anisotropic etching of the layer 23 of PMD dielectric material which is not protected by the third mask M3 is carried out, for example by means of a reactive-ion etching (RIE) method. The third masque M3 is then removed, for example by a stripping method.

A twelfth step 112 of the method 100 is shown in sectional view in FIG. 12. The sectional view is along the first plane P1. According to a twelfth step 112, a layer 24 of pre-contacts metal is deposited. The pre-contacts metal may be, for example, tungsten.

A thirteenth step 113 of the method 100 is shown in sectional view in FIG. 13. The sectional view is along the first plane P1. According to the thirteenth step 113, a step for polishing the layer 24 of the pre-contact metal is carried out, for example by CMP chemical-mechanical polishing. This polishing step is done to break the circuit between the gate zones 16, the first source and drain zones 18 and the second source and drain zones 19. This step for breaking the circuit however has the drawback of also removing zones 22 of silicide previously formed on the surface of gate zones 16.

The method 100 of the state of the art described above shows the difficulty experienced in obtaining self-aligned contacts in a "gate first" approach whilst ensuring silicised gates are obtained.

SUMMARY

An aspect of the invention offers a solution to the problem described above, by offering a method for making an integrated circuit with self-aligned contacts using a "gate-first" approach, which in particular allows gate zones, source zones and drain zones to be obtained where the circuit between these are broken whilst ensuring a zone of low electrical resistivity is obtained at the surface of the gate zones.

An embodiment of the invention therefore relates to a method for making an integrated circuit on a substrate which includes the following steps:
  making a gate stack on the surface of an active zone, comprising the following steps:
    deposition of a first gate dielectric layer which extends over the active zone;
    deposition of a gate conductive layer which extends over the layer of first dielectric;
    deposition of a layer of a first metal, where the layer of the first metal extends over the gate conductive layer;
    deposition of a layer of a second metal, where the layer of the second metal extends over the layer of the first metal;
    deposition of a layer of a second dielectric extending over the layer of the second metal;
  partial etching of the gate stack for the formation of a gate zone on the active zone;
  making insulating spacers on either side of the gate zone on the active zone;
  making source and drain electrodes zones;
  making silicidation zones on the surface of the source and drain zones; etching, in the gate zone on the active zone, of the second dielectric layer and of the layer of second metal with a stop on the layer of the first metal, so as to form a cavity between the insulating spacers;
  making a protective plug at the surface of the layer of first metal of the gate zone on the active zone, where the protective plug fills the cavity.

As a result of the method, a gate stack is beneficially used which comprises a layer of a first metal and a layer of a second metal. Thus during the etching step of the dielectric layer, on the gate zone on the active zone, the layer of first metal can be preserved, with this forming a zone of low electrical resistivity at the surface of the gate zone on the active zone. Making a protective plug at the surface of the gate zone on the active zone provides protection of the layer of first metal during later integration steps, in particular during etching and/or polishing steps. The fact that in the method spacers are formed around the gate zone on the active zone, and then that the layer of dielectric and the layer of second metal of the gate zone on the active zone are etched, beneficially means that a cavity is formed at the top of the gate zone on the active zone, between the insulating spacers. Thanks to this cavity, which is subsequently filled by the protective plug, the height of the gate zone on the active zone is reduced, while allowing the distance between the gate zone on the active zone and a future contact to be increased. The gate zone on the active zone will in effect be separated from the future contact by the layer of the second metal and by the protective plug. Thus parasitic capacitive coupling between the gate zone on the active zone and the future contact can be beneficially reduced.

Besides the characteristics which have just been stated in the preceding paragraph, the method according to an embodiment of the invention may exhibit one or more additional characteristics from amongst the following, considered individually or according to technically possible combinations:
  The layer of first metal is a layer made of a refractory metal alloy. A refractory metal is a metal capable of withstanding a thermal budget of the order of 1000° C., in particular during the creation of the source and drain zones, which usually involves an implantation step followed by a thermal annealing step.
  The layer of first metal is a layer made of one of the following materials
    an alloy of Titanium Ti;
    an alloy of Tungsten W;

an alloy of Tantalum Ta;
an alloy of a metal and silicon Si;
When the layer of the first metal is an alloy of metal and silicon, the layer of first metal can beneficially be obtained by a step of silicidation of the gate conductive layer, the gate conductive layer then being made, for example, of polycrystalline silicon.
The layer of the second metal is a layer made of a refractory metal alloy.
The layer of the second metal is a layer made of one of the following materials
an alloy of Titanium Ti;
an alloy of Tungsten W;
an alloy of Tantalum Ta;
an alloy of any other refractory metal.
The first metal of the layer of first metal layer is beneficially different from the second metal of the layer of the second metal. Thus during etching of the dielectric layer and of the layer of second metal, stopping the etching on the layer of first metal in order to preserve the layer of first metal is facilitated,
The layer of second metal may be etched selectively relative to the layer of the first metal.
The selectivity ratio between etching of the layer of second metal and etching of the layer of first metal is greater than 5:1.
The term "selectivity ratio between etching of the layer of second metal and etching of the layer of first metal is greater than 5:1" means that during a given etching step, the layer of second metal may be etched five times faster than the layer of first metal,
The thickness of the layer of first metal is greater than or equal to 15 nm.
The layer of second metal has a thickness between 20 nm and 50 nm.
The thickness of the gate conductive layer is greater than or equal to 15 nm.
The cumulative thickness of the gate conductive layer and of the layer of first metal is less than or equal to 100 nm.
The method of an embodiment of the invention moreover comprises the following steps:
deposition of a conductive layer over the entire device;
polishing of the conductive layer in order to break the circuit between the source and drain silicidation zones.
The method of an embodiment of the invention moreover comprises the following steps:
deposition of a stop layer over the entire device;
deposition of a layer of a dielectric on the stop layer;
selective etching of the dielectric layer and of the stop layer to expose the conductive layer, so as to cut trenches above the source and drain silicidation zones;
filling of the trenches with a conductive material in order to make contacts on the source and drain silicidation zones.
Integrated circuit obtained by a manufacturing method according to an embodiment of the invention, comprising:
at least one active zone and at least one insulation zone;
at least one gate zone on the active zone, comprising a layer of first dielectric, a gate conductive layer, a layer of a first metal and a protective plug;
at least one gate zone on the insulation zone, comprising a layer of first dielectric, a gate conductive layer, a layer of a first metal and a layer of a second metal.

An embodiment of the invention and its various applications will be better understood on reading the following description and on examination of the figures which accompany it.

BRIEF DESCRIPTION OF THE FIGURES

The figures are given for indication purposes and are not in any way intended to limit the invention.

FIGS. 24a, 24b, 24c and 24d respectively show a top view and a first, second, and third sectional view of an eleventh step in the method according to an embodiment of the invention.

DETAILED DESCRIPTION

Unless otherwise stated, a given element appearing in different figures has the same unique reference number.

FIGS. 14a to 28d schematically represent the steps in a method 200 according to an embodiment of the invention in the context of making an integrated circuit with self-aligned contacts and using a "gate-first" approach. FIG. 29 is a diagram which summarises the organisation of the various steps in the method 200 according to an embodiment of the invention. Thus the method 200 offers an alternative to the conventional approach described previously in association with FIGS. 1a to 13, and which is incompatible with the need to preserve the silicide zones on the gate zones.

A first step 201 in the method 200 is shown in FIGS. 14a, 14b, 14c and 14d.

Figure 1A:
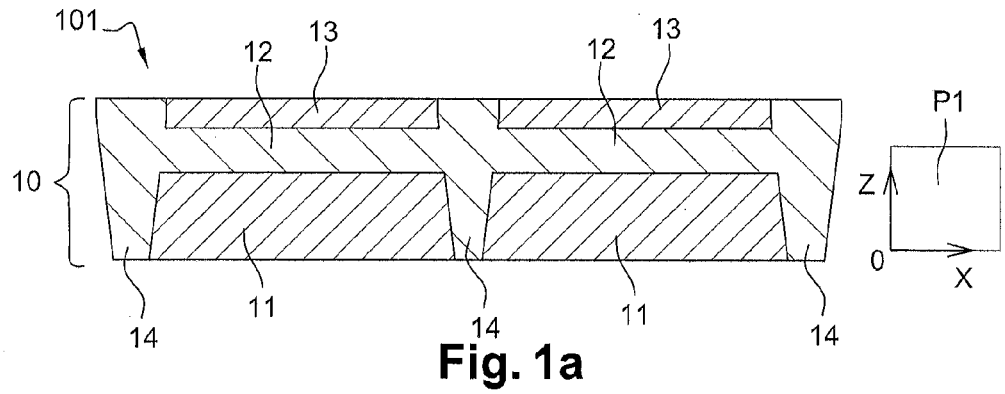
FIGS. 1a to 13 show the steps in a method for making integrated circuits with self-aligned contacts using a "gate-first" approach according to the state of the art.
Figure 1B:
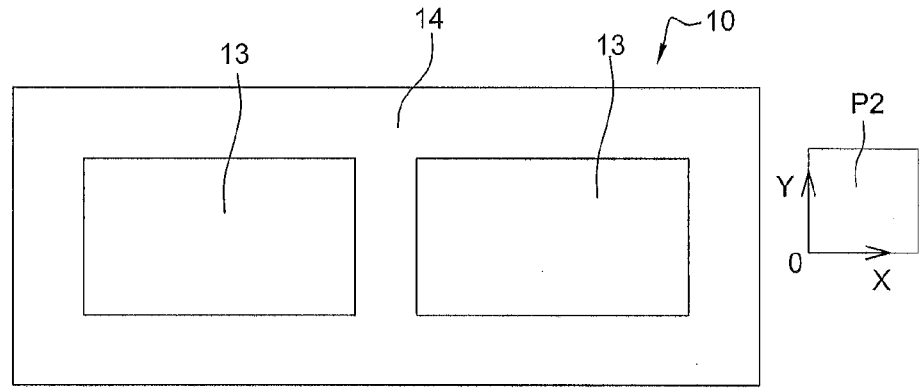
Figure 2:
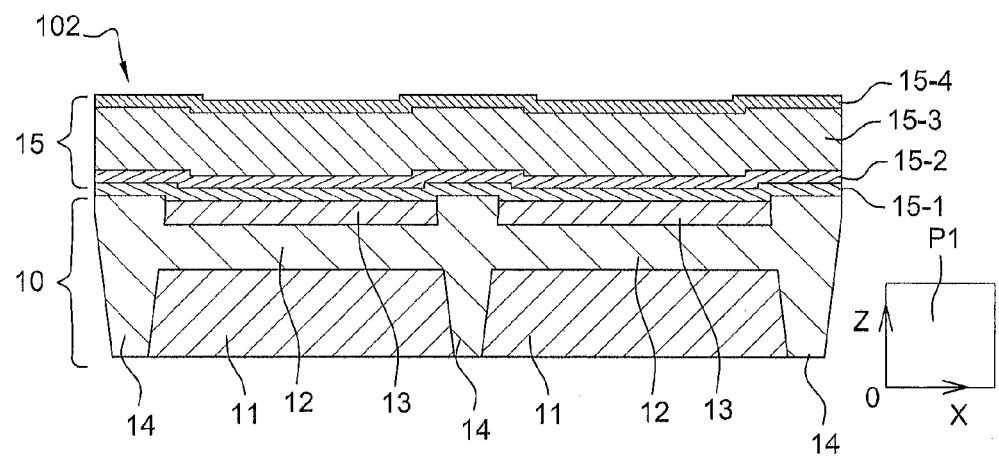
Figure 3A:
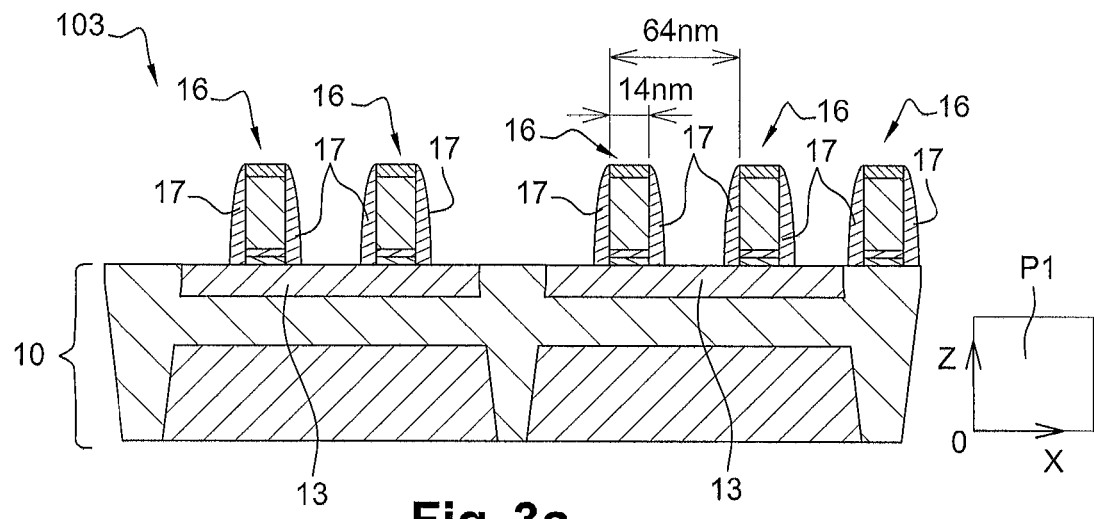
Figure 3B:
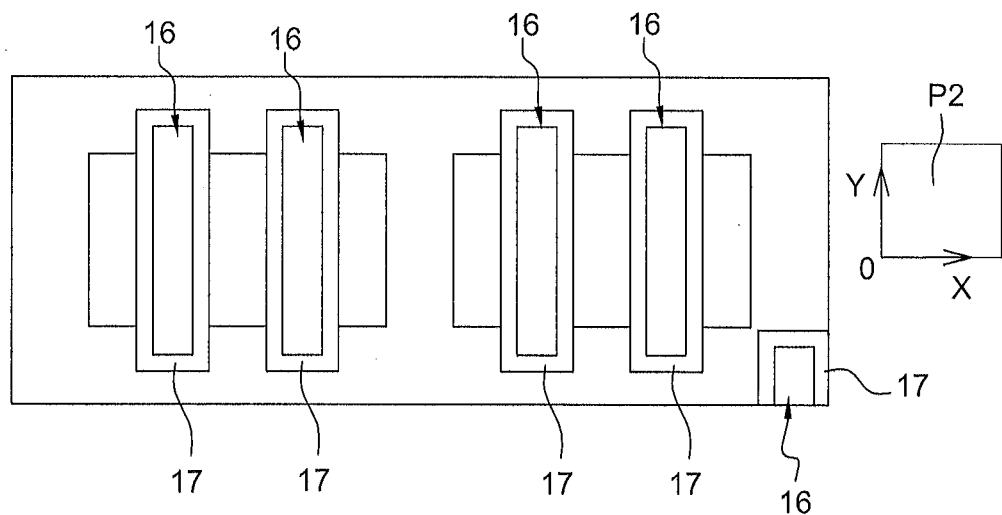
Figure 4A:
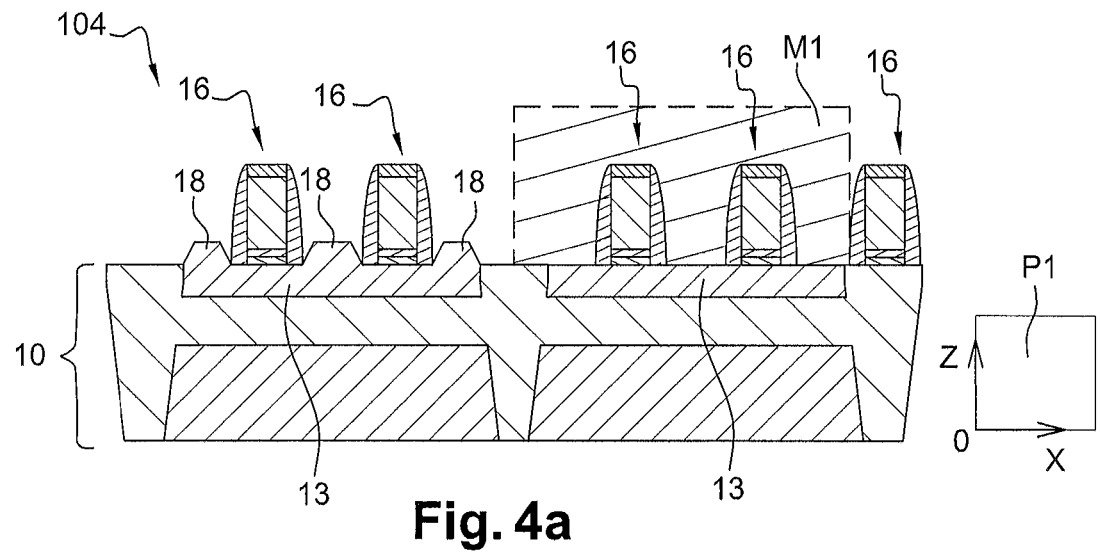
Figure 4B:
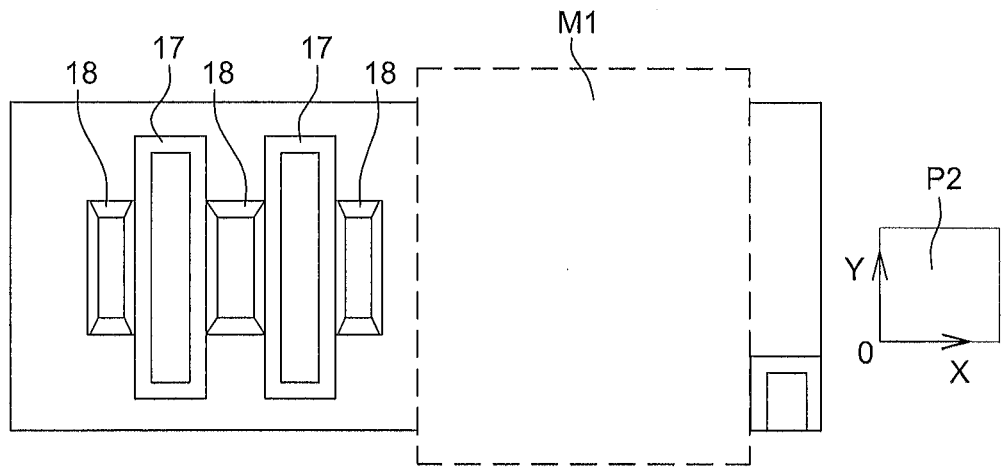
Figure 5A:
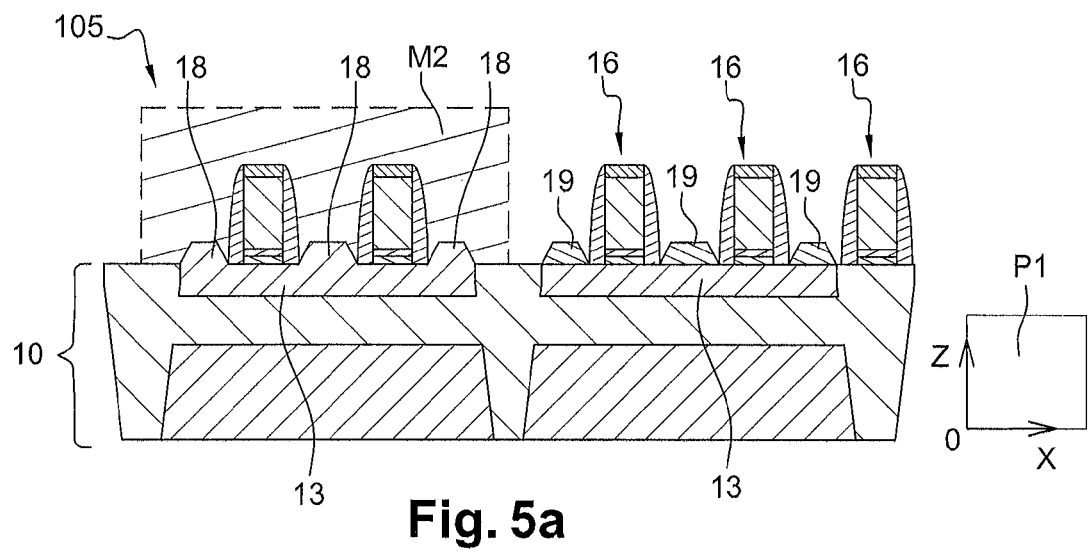
Figure 5B:
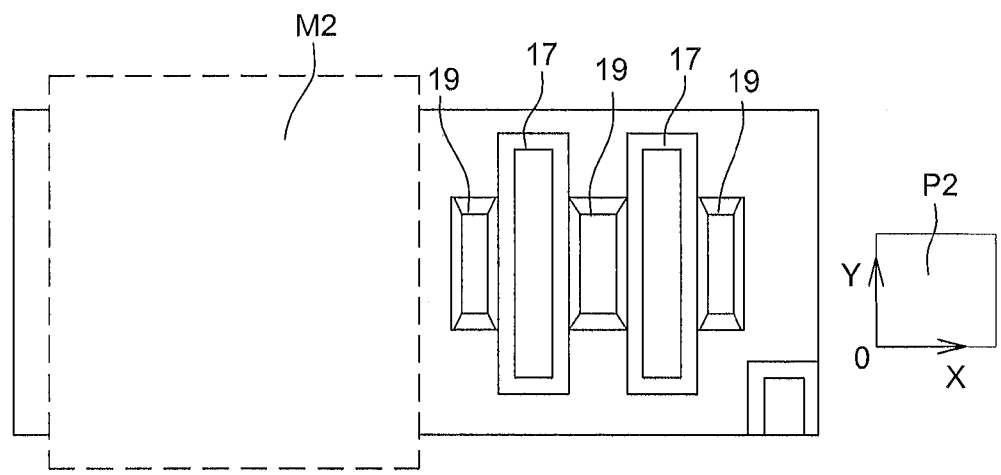
Figure 6A:
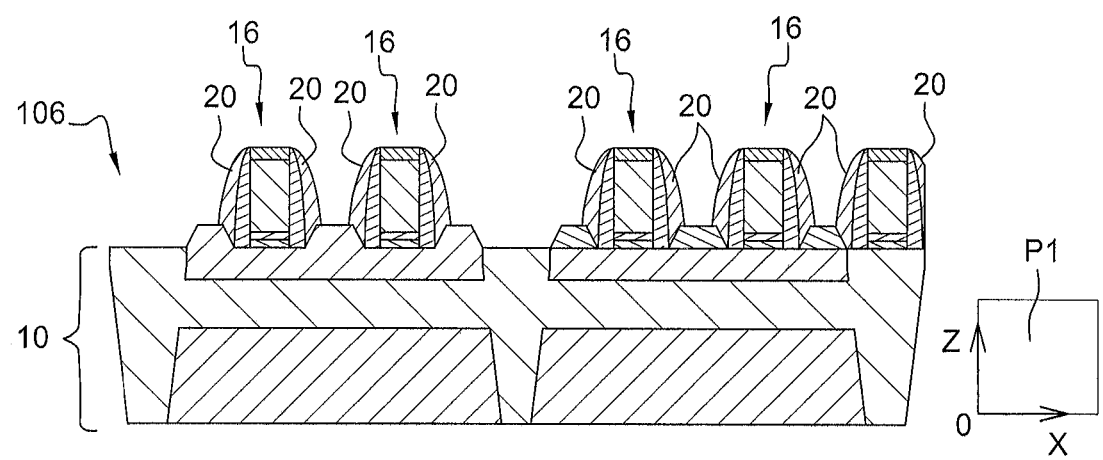
Figure 6B:
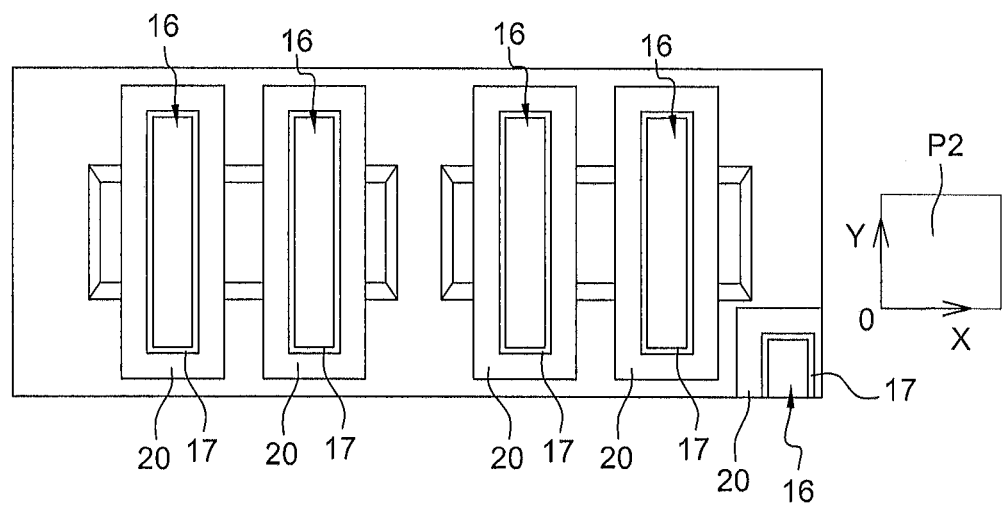
Figure 7:
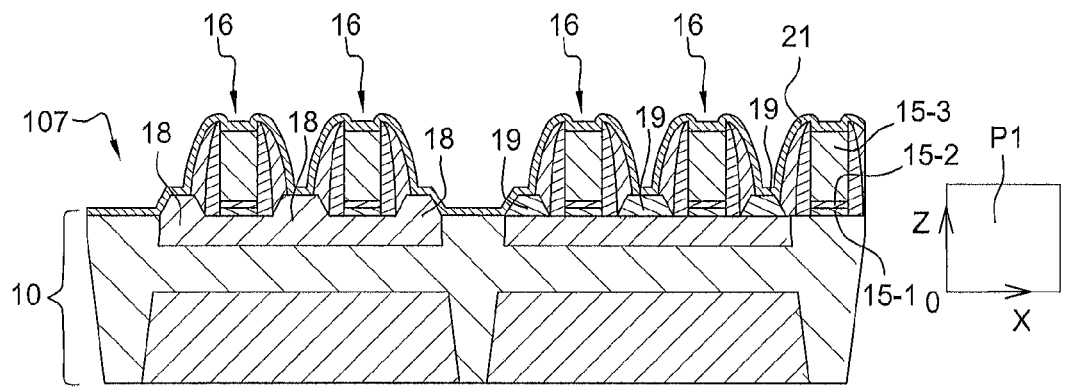
Figure 8A:
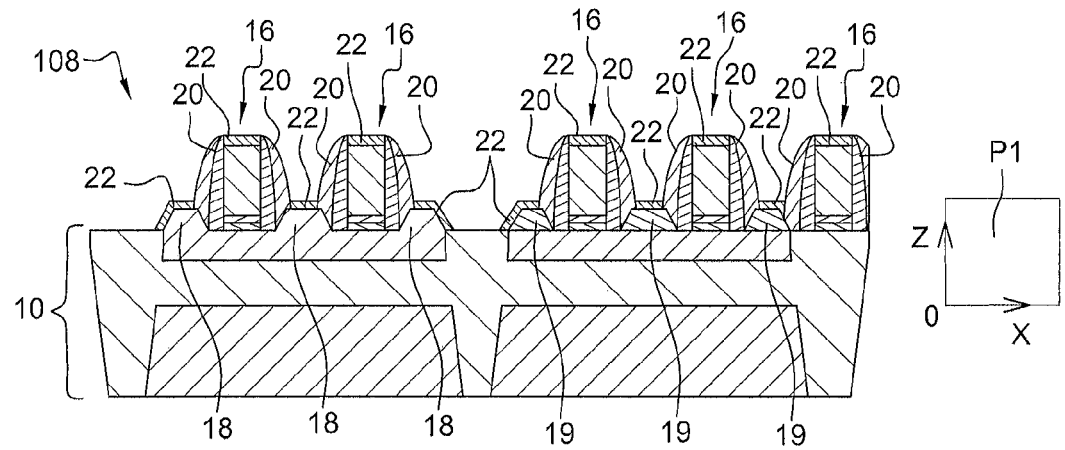
Figure 8B:
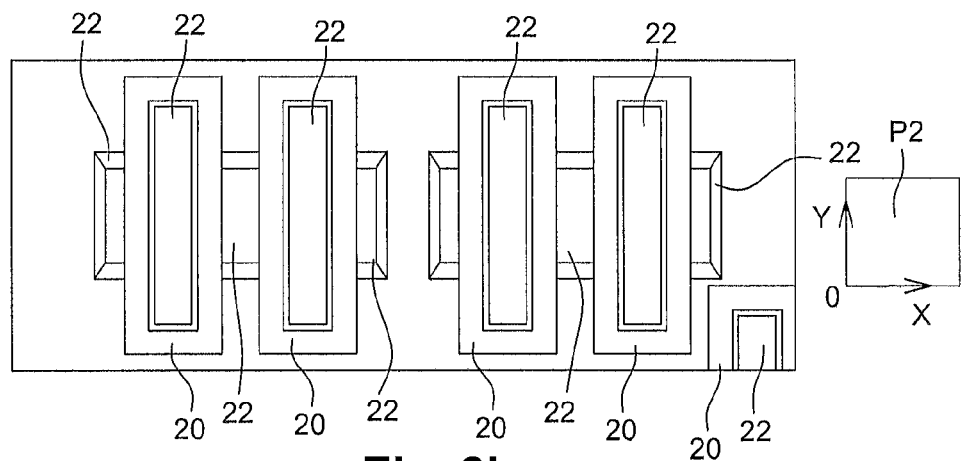
Figure 9:
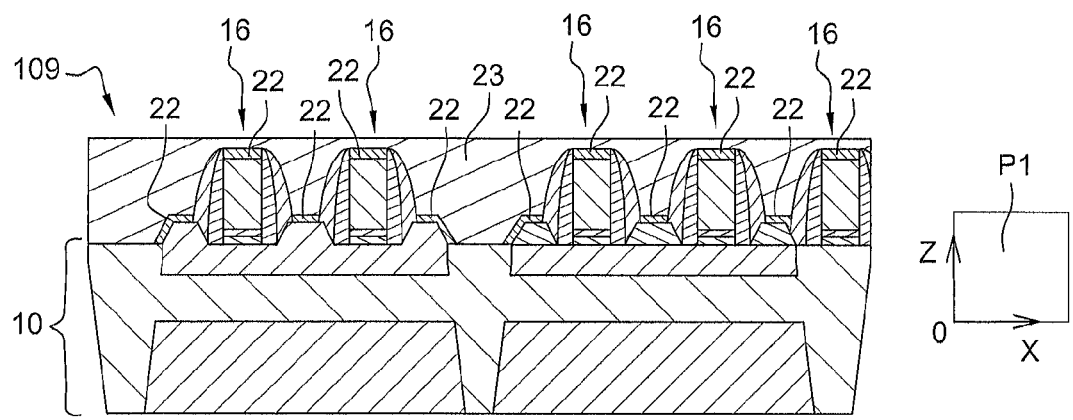
Figure 10:
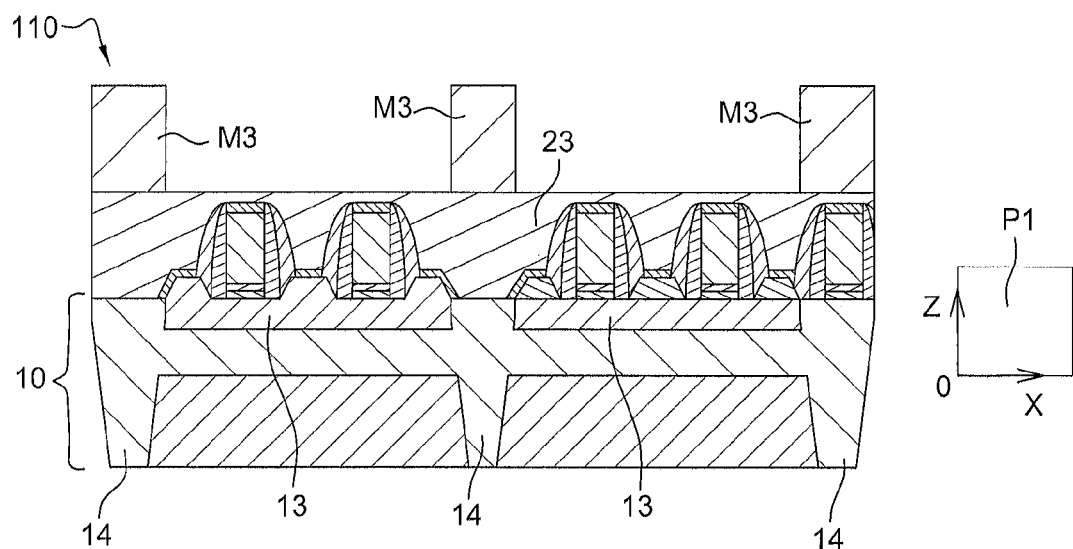
Figure 11A:
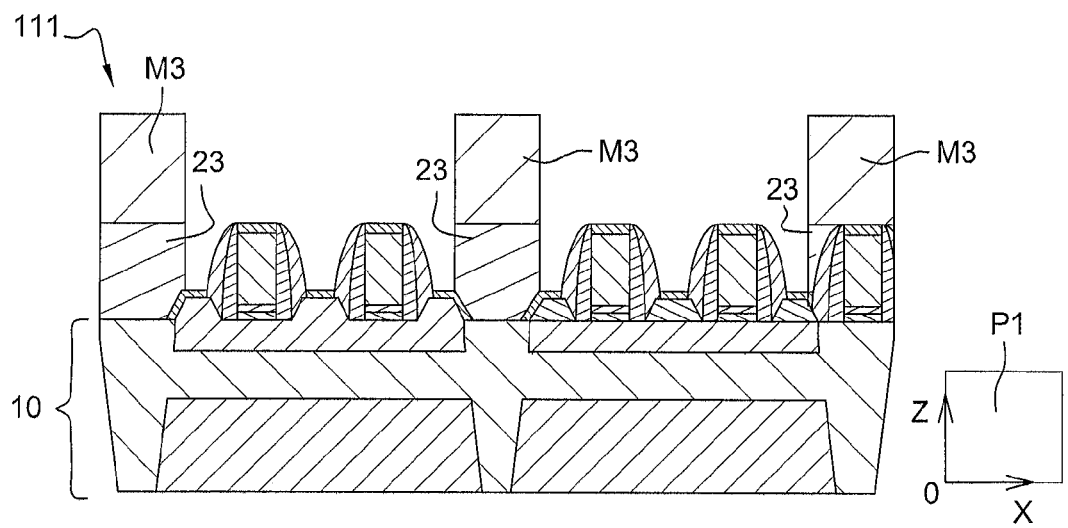
Figure 11B:
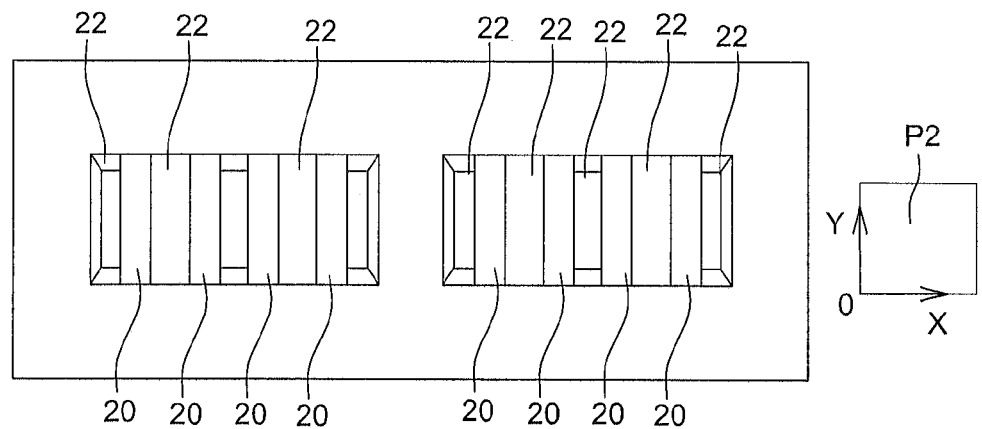
Figure 12:
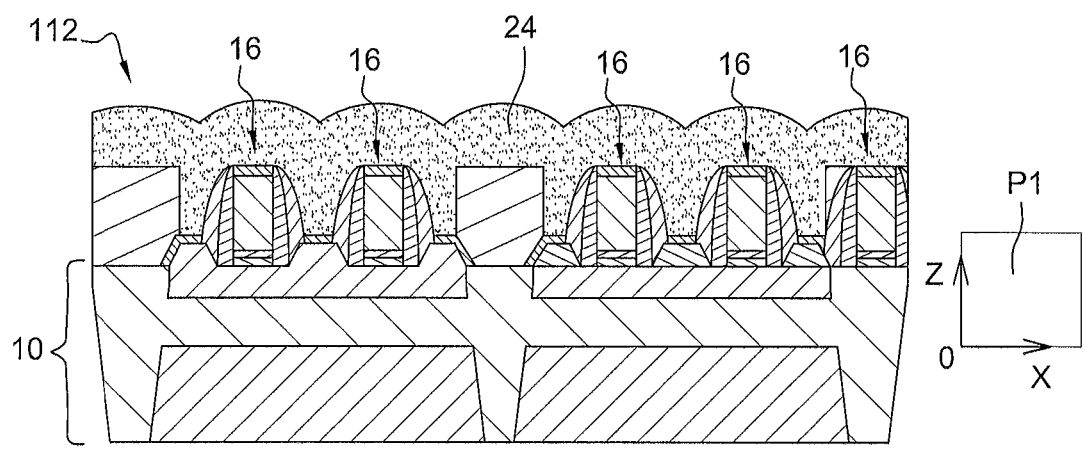
Figure 13:
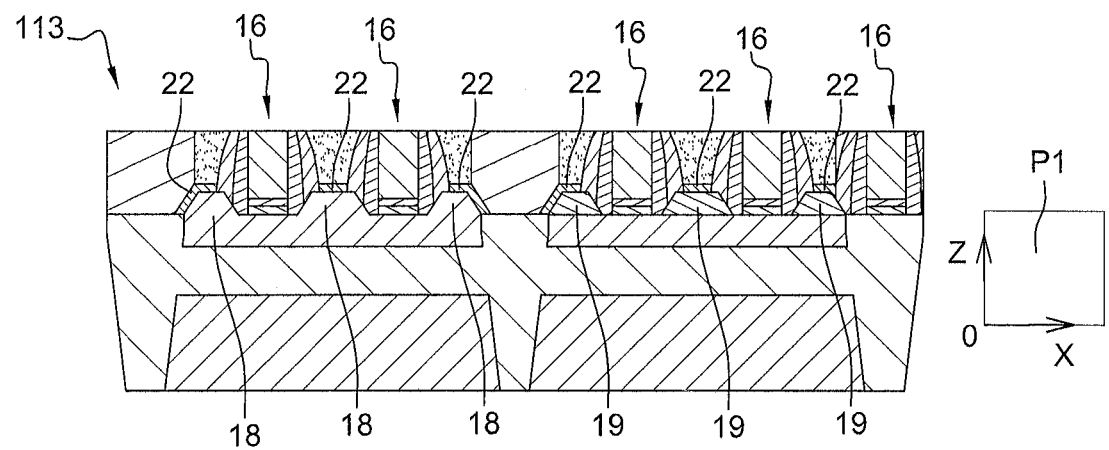
Figure 14A:
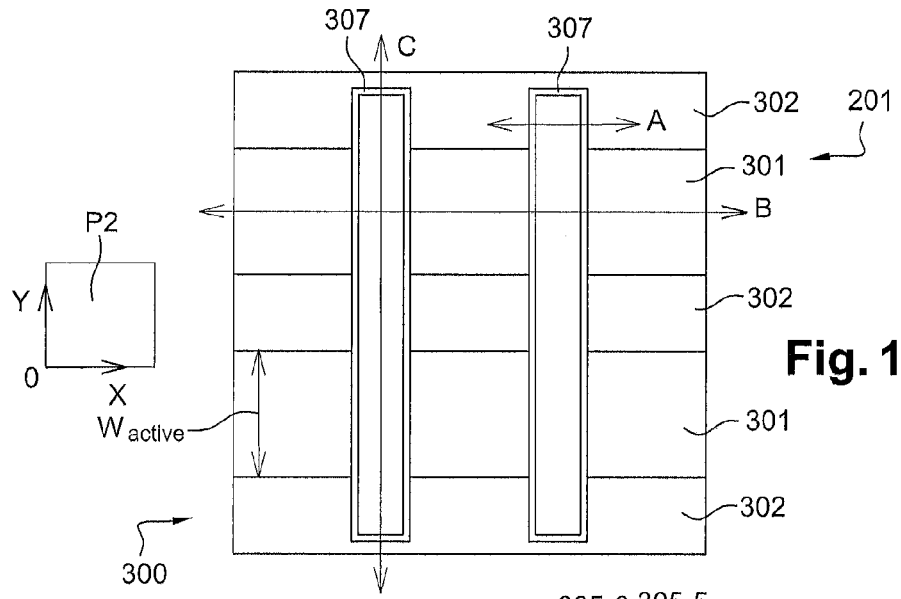
FIGS. 14a, 14b, 14c and 14d respectively show a top view and a first, second and third sectional view of a first step of a method according to an embodiment of the invention allowing an integrated circuit to be made with self-aligned contacts using a "gate-first" approach.

FIG. 14a shows a top view, along second plane P2 with orthogonal X and Y axes, of the device during the first step 201. A first section plane A, a second section plane B and a third section plane C are shown in FIG. 14a. The first section plane A and the second section plane B are parallel to the first plane P1 with orthogonal X and Z axes. The third section plane C is parallel to a third section plane P3 with orthogonal Y and Z axes. The third section plane C is therefore perpendicular to the first and to the second section planes A and B.

Figure 14B:
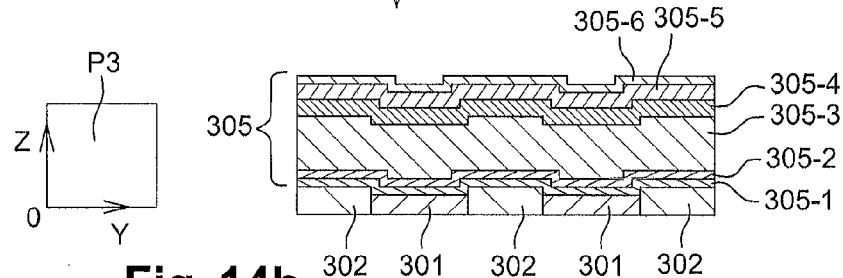
Figure 14C:
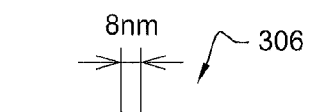

FIG. 14c is a sectional view along the first section plane A of the device during the first step 201.

Figure 14D:
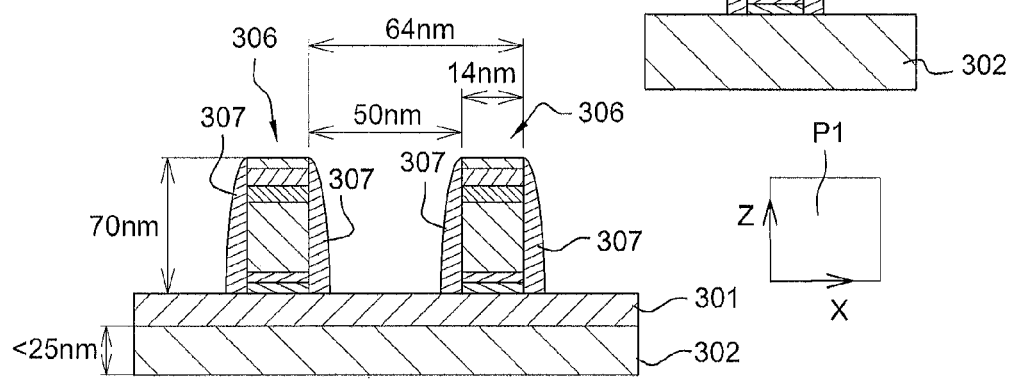

FIG. 14d is a sectional view along the second section plane B of the device during the first step 201.

FIG. 14b is a sectional view along the third section plane C of the device during the first step 201.

During the first step 201 a start is made by making an initial layer 300 on a substrate. The substrate is, in the example shown, an SOI type substrate. The substrate may however also be a "bulk" type silicon substrate. When the substrate is of the SOI type, it comprises an insulating layer 303, made for example of $SiO_2$ oxide, also called Box. The insulating layer 303 has a thickness measured along the axis OZ which is typically less than 25 nm.

The initial layer 300 comprises, in the example shown, several active zones 301, separated from each other by insulation zones 302. The active zones 301 may be made of monocrystalline silicon. The insulation zones 302 are formed of a dielectric material, for example an oxide of silicon. The active zones 301 and insulation zones 302 extend, in the example shown, over the insulating layer 303. The active zones 301 have a thickness which is typically less than or equal to 5 nm. The active zones have 301 have a width $W_{active}$ measured along the Y axis.

A gate stack 305 is then deposited on the initial layer 300. The gate stack 305 comprises, in the example in this description:
  a first layer 305-1 of a high-k dielectric, with the first layer 305-1 extending over the initial layer 300;
  a second layer 305-2 of titanium nitride, with the second layer 305-2 extending over the first layer 305-1;
  a third layer 305-3 of a gate conductive material, for example polysilicon, with the third layer 305-3 extending over the second layer 305-2;
  a fourth layer 305-4 of a first metal, with the fourth layer 305-4 extending over the third layer 305-3;
  a fifth layer 305-5 of a second metal, with the fifth layer 305-5 extending over the fourth layer 305-4;
  a sixth layer 305-6 of a dielectric, for example a nitride, with the sixth layer 305-6 extending over the fifth layer 305-5;

The present description is made for the case in which the first layer 305-1 is a high-k dielectric layer; embodiments of the invention however are not limited to this and relate more generally to a gate stack 305 which comprises a first layer 305-1 of a dielectric.

Similarly, this description is made for the case in which a gate stack 305 comprises the second layer 305-2 made of titanium nitride; embodiments of the invention however are not restricted to this case and relate more generally to any gate stack comprising the first layer 305-1 of a dielectric and the third layer 305-3 of a gate conductive layer and which optionally comprises the second layer 305-2.

The first metal of the fourth layer 305-4 is beneficially an alloy of titanium Ti, an alloy of tungsten W, an alloy of tantalum Ta or an alloy of a metal and of silicon Si. When the fourth layer 305-4 is an alloy of a metal and silicon, the fourth layer 305-4 can beneficially be obtained by a step of silicidation of the third gate conductive layer 305-3, the gate conductive layer being made, for example, of polycrystalline silicon.

The second metal of the fifth layer 305-5 is beneficially an alloy of titanium Ti, for example titanium nitride, an alloy of tungsten W an alloy of tantalum Ta. The height of the gate stack 305 measured along the axis OZ is typically between 30 nm and 75 nm.

Gate zones 306 are then defined in the gate stack 305. Each gate zone 306 forms a line which extends parallel to the Y axis. Each gate zone 306 has, in the example shown, a width of 14 nm, measured along the direction OX. The separation spacing step, along direction OX, between the consecutive gate zones 306, also called "pitch" or technology node, is 64 nm in the example shown.

This description is made for the specific case of a technology node of 64 nm. Embodiments of the invention, however, are not limited to spacing steps of 64 nm and in particular relate to spacing steps of between 20 nm and 64 nm.

The dimensions chosen for the gate zones 306 may typically be as follows:
  The first layer 305-1 of dielectric typically has a thickness, measured along axis OZ, of 5 nm;
  The second layer 305-2 typically has a thickness, measured along axis OZ, of 5 nm;
  the third layer 305-3 and the fourth layer 305-4 respectively have a thickness, measured along the Z axis, typically greater than or equal to 15 nm, with the sum of the thickness of the third layer 305-3 and of the thickness of the fourth layer 305-4 being between 30 nm and 100 nm. The smaller the desired technology node, then beneficially, the smaller the sum of the thicknesses of the third layer 305-3 and of the fourth layer 305-4, so as to minimise any parasitic capacitances. The thickness of the fourth layer 305-4 should, however, be sufficient to reduce the resistivity of the gate zone 306;
  the thickness of the fifth layer 305-5 of second metal is typically, measured along the OZ axis, between 20 nm and 50 nm. The thickness of the fifth layer 305-5 is chosen in accordance with the need to perform the later polishing and etching steps, and in particular in accordance with the need for selectivity of etching and/or for precision of the etching stop that has to be implemented. In effect, one wishes to ensure that the thickness of the layer 305-5 will be sufficient for the fourth layer 305-4 to be preserved at the surface of the gate zones 306;
  the sixth layer 305-6 of dielectric typically has a thickness, measured along axis OZ, of 15 nm;

Since the method 200 according to an embodiment of the invention is of the "gate-first" approach type, each gate zone 306 is directly made in the gate stack 305. Thus the gate stack 305 deposited during the first step 201 is directly made up of materials destined to form the gate zones 306.

The gate zones 306 may be made in different ways, in particular depending on the desired dimensions of the integrated circuit to be made.

In effect, when integrated circuits are made which correspond to fairly high technology nodes—for example which are in accordance with a technology node greater than 32 nm, the gate zones 306 may be made using conventional photo-lithography. In this case, following the deposition of the gate stack 305 on the initial layer 300, a mask defining the shape of the gate zones 306 is deposited on the gate stack 305. The gate stack is then illuminated through the mask. The illuminated portions of the gate stack 305 are then removed using an appropriate solvent. When the integrated circuit that one wishes to make using the method 200 according to an embodiment of the invention corresponds to a small technology node—for example to a technology node of less than 32 nm, the gate zones 306 can be made using double exposure ("double patterning") or "spacer patterning" techniques. The double patterning technique is known to those skilled in the art and involves carrying out two photo-lithography steps to make a single level. In effect, according to this method, a first photo-lithography step is first of all carried out in order to define one of two patterns and then a second photo-lithography step is carried out to define the remaining patterns. This technique is used to make patterns with a resolution which can be twice that obtained using conventional lithographic techniques.

First insulating spacers 307 are then made on either side of each gate zone 306. The first spacers 307 are made of a dielectric material, which may be, for example, a nitride or an oxide/nitride bi-layer. All the first spacers 307 may be made of the same material, or they may be made from different materials. The maximum thickness measured along the X axis of the first spacers 307 is typically 8 nm.

The methods used to make the first insulating spacers 307 are known in the prior art. The first insulating spacers 307 can be made, for example, in the following way:
- a layer of insulating material forming the first insulating spacers 307 (for example nitride or a nitride-oxide bi-layer) is deposited over all the gate zones 306 and over the initial layer 300;
- the layer of insulating material is anisotropically etched so as to preserve the vertical parts of the layer made of insulating material. The vertical parts of the layer made of insulating material then form the first spacers 307 on either side of each gate zone 306.

The upper surfaces of the first insulating spacers 307 can then be planarised such that they are aligned with the upper surfaces of the gate zones 306. This step may be carried out, for example, by CMP chemical-mechanical polishing. The first insulating spacers 307 will contribute to insulating the gate zones 306 from the contacts that will subsequently be made.

A second step 202 in the method 200 is shown in FIGS. 15a, 15b, 15c and 15d.

Figure 15A:
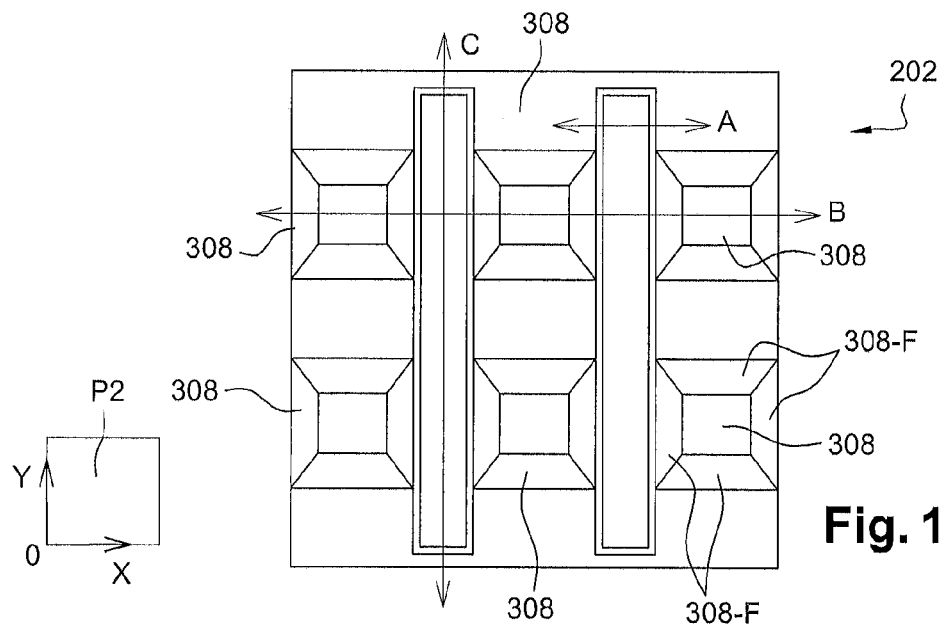
FIGS. 15a, 15b, 15c and 15d respectively show a top view and a first, second, and third sectional view of a second step in the method according to an embodiment of the invention.

FIG. 15a shows a top view along the second plane P2 of the device during the second step 202.

Figure 15B:
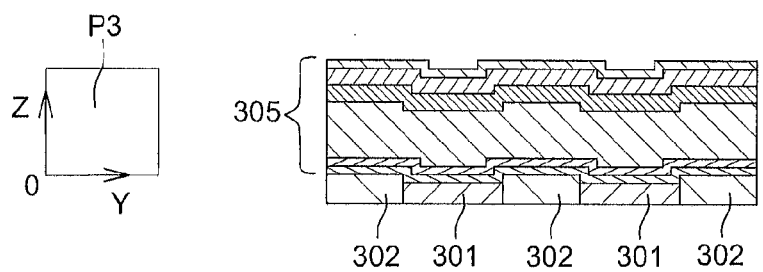
Figure 15C:
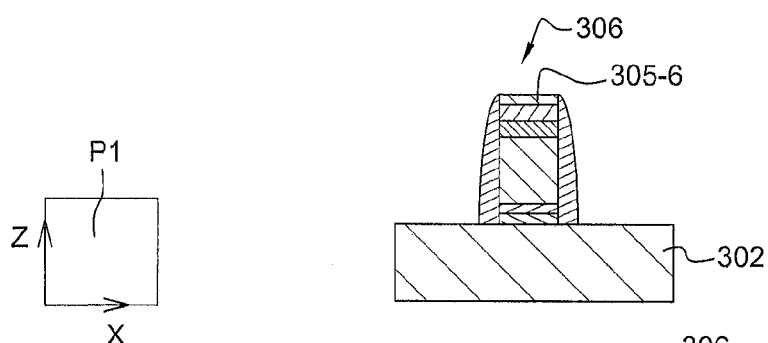

FIG. 15c is a sectional view along the first section plane A of the device during the second step 202.

Figure 15D:
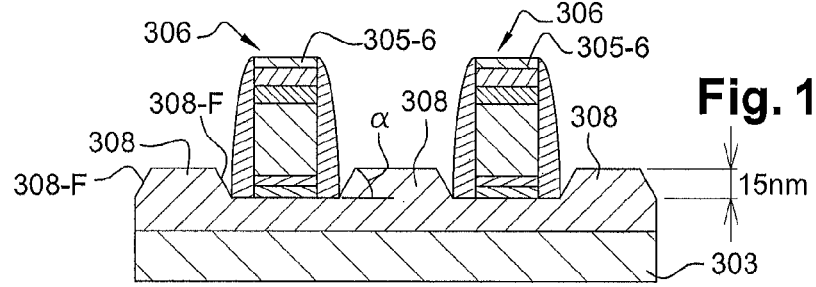

FIG. 15d is a sectional view along the second section plane B of the device during the second step 202.

FIG. 15b is a sectional view along the third section plane C of the device during the second step 202.

Source and drain zones 308 are made during the second step 202. The zones 308 are located on the active zones 301 on either side of the gate zones 306 on active zones 301 surrounded by the first insulating spacers 307. Making source and drain zones 308 may include a step for epitaxial growth from active zones 301 made of Si. Source and drain zones 308 are then beneficially in the form of a truncated a pyramid which has a square base which extends along the second plane P2 and which typically has a height, measured along axis Z, of 15 nm. Each source or drain zone 308 then beneficially has four facets 308-F which are the four sides of the truncated pyramid. The facets 308-F typically make an angle α of 72° with the square base. Such facets 308-F beneficially allow the distances to be increased between, on one hand, the gate zones 306 on active zones 301 and on the other hand source and drain zones 308 adjacent to each gate zone 306 on active zone 301.

The source and drain zones 308 are doped in situ if appropriate, during growth, or during a specific implantation step.

A third step 203 in the method 200 is shown in FIGS. 16a, 16b, 16c and 16d.

Figure 16A:
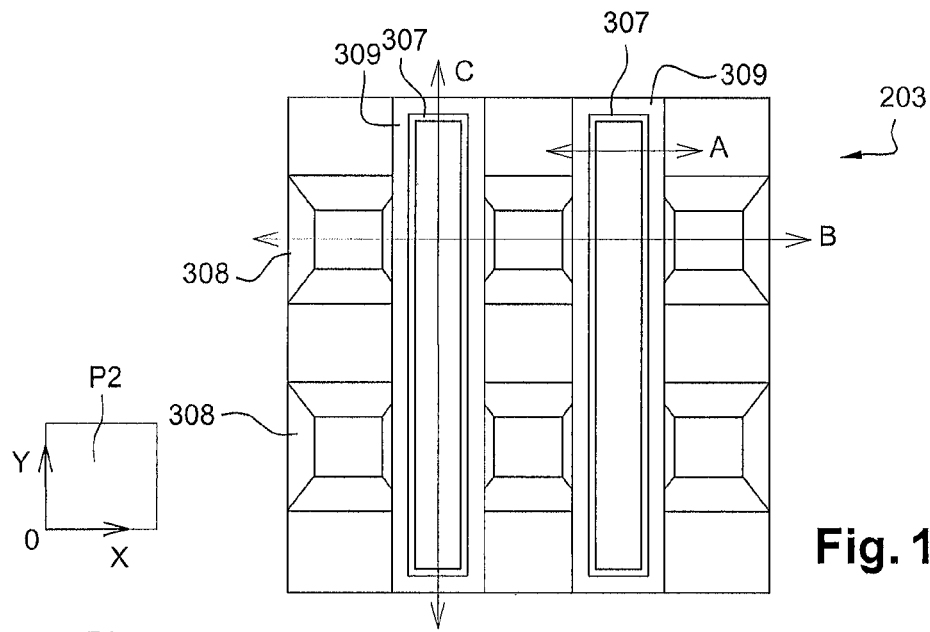
FIGS. 16a, 16b, 16c and 16d respectively show a top view and a first, second, and third sectional view of a third step in the method according to an embodiment of the invention.

FIG. 16a shows a top view along the second plane P2 of the device during the third step 203.

Figure 16B:
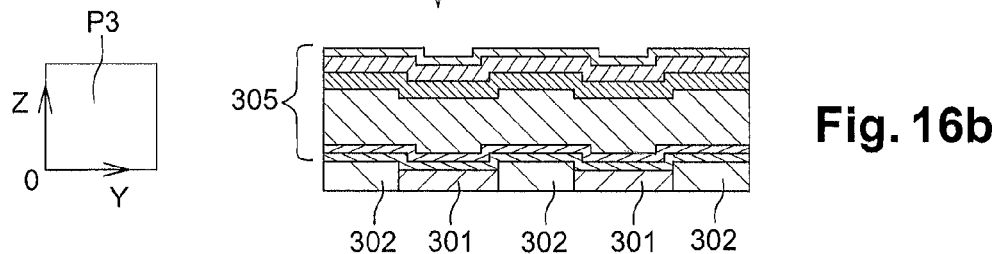
Figure 16C:
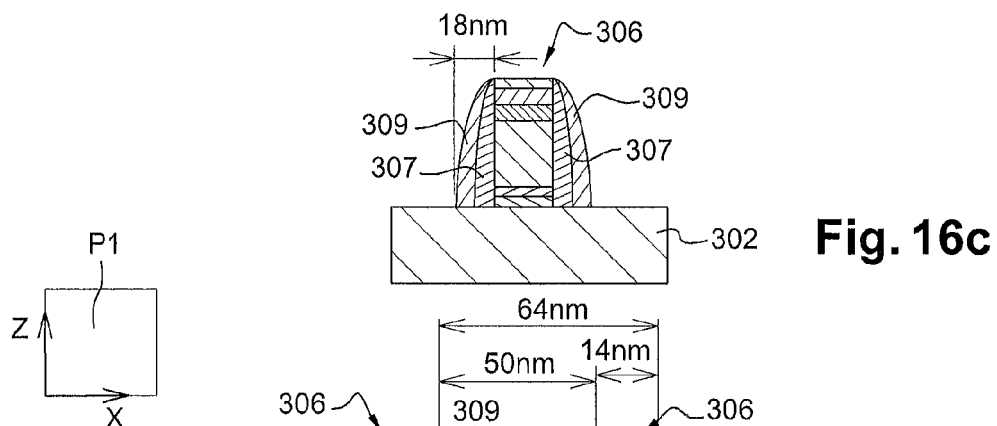

FIG. 16c is a sectional view along the first section plane A of the device during the third step 203.

Figure 16D:
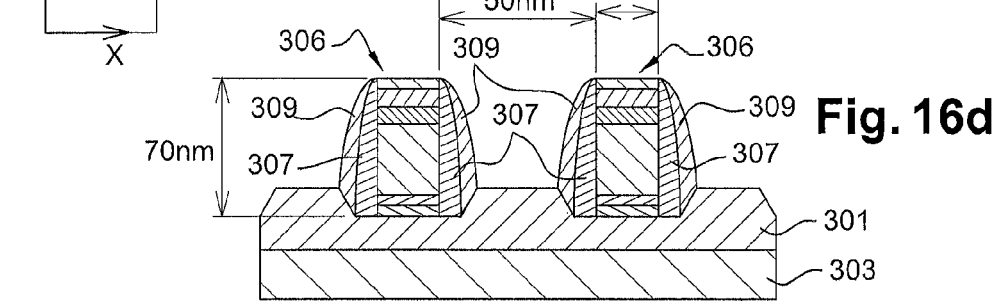

FIG. 16d is a sectional view along the second section plane B of the device during the third step 203.

FIG. 16b is a sectional view along the third section plane C of the device during the third step 203. During the third step 203 second insulating spacers 309 are made around first insulating spacers 307. The second insulating spacers 309 are made from a dielectric material, for example a nitride. The maximum thickness, measured along the X axis, of the second spacers 309 is typically 10 nm. The maximum cumulative thickness of the first spacers 307 and of the second spacers 309 measured along the X axis is therefore typically 18 nm.

A fourth step 204 in the method 200 is shown in FIGS. 17a, 17b, 17c and 17d.

Figure 17A:
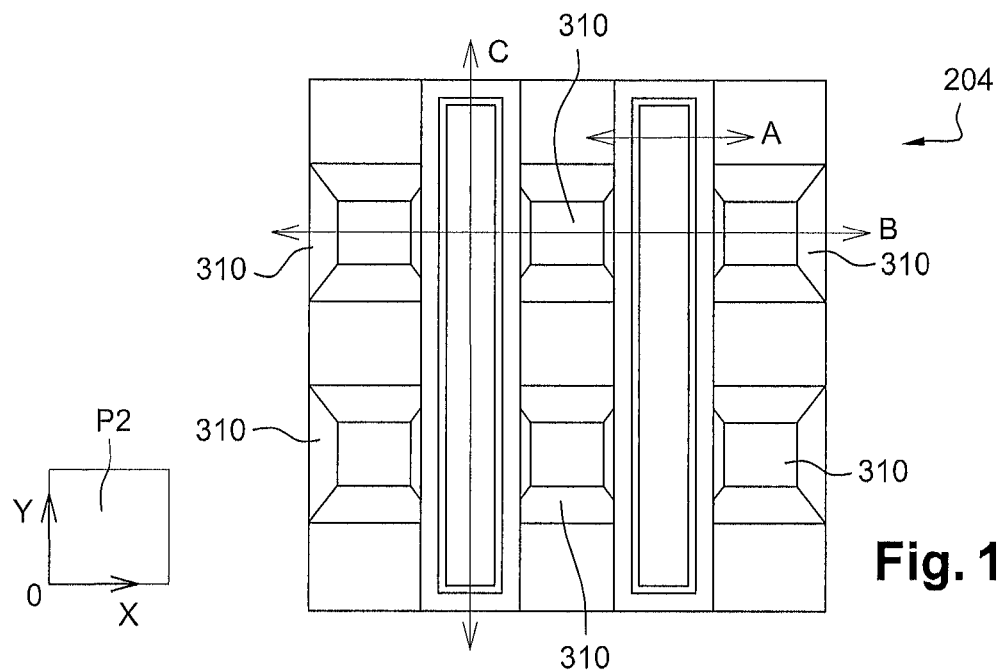
FIGS. 17a, 17b, 17c and 17d respectively show a top view and a first, second, and third sectional view of a fourth step in the method according to an embodiment of the invention.

FIG. 17a shows a top view along the second plane P2 of the device during the fourth step 204.

Figure 17B:
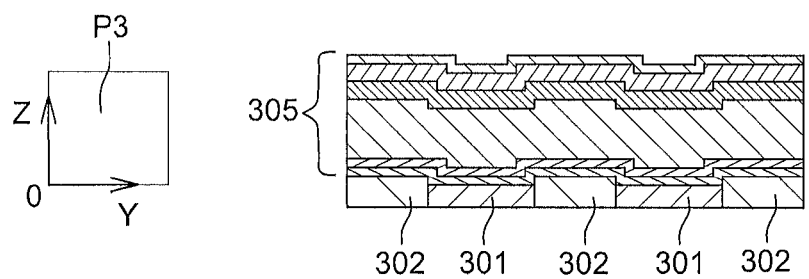
Figure 17C:
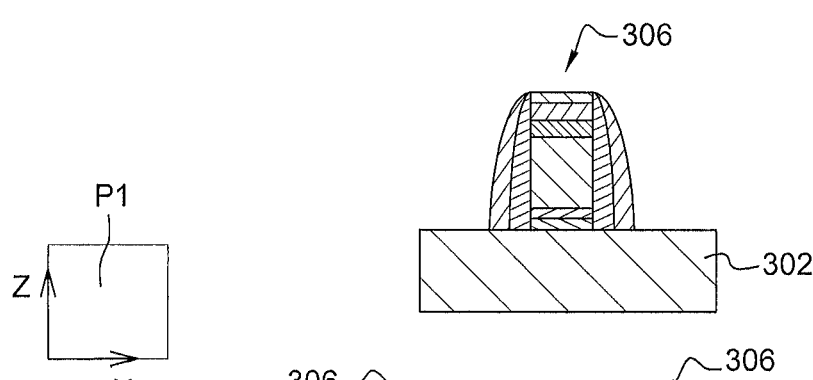

FIG. 17c is a sectional view along the first section plane A of the device during the fourth step 204.

Figure 17D:
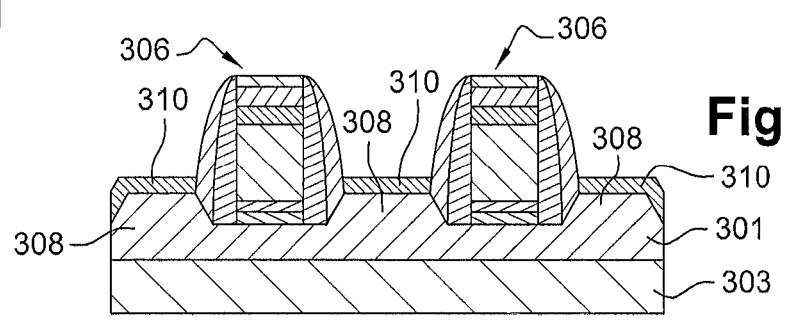

FIG. 17d is a sectional view along the second section plane B of the device during the fourth step 204.

FIG. 17b is a sectional view along the third section plane C of the device during the fourth step 204.

Silicidation zones 310 at the surface of the source and drain zones 308 are made during the fourth step 204. Silicidation is known in the prior art; it is equivalent to the metallisation of source and drain zones 308 using the chemical reaction between the constituent silicon of the source and drain zone 308 and a metal, for example nickel, in order to form zones of low resistivity. It will be noted that unlike the aforementioned method 100, no silicidation zone is created at this stage of the method in gate zones 306, at the surface of which there is still the sixth layer 305-6 made of nitride. In effect the gate zones 306 already include the fourth layer 305-4 of the first metal, which provides a silicidation function.

A fifth step 205 in the method 200 is shown in FIGS. 18a, 18b, 18c and 18d.

Figure 18A:
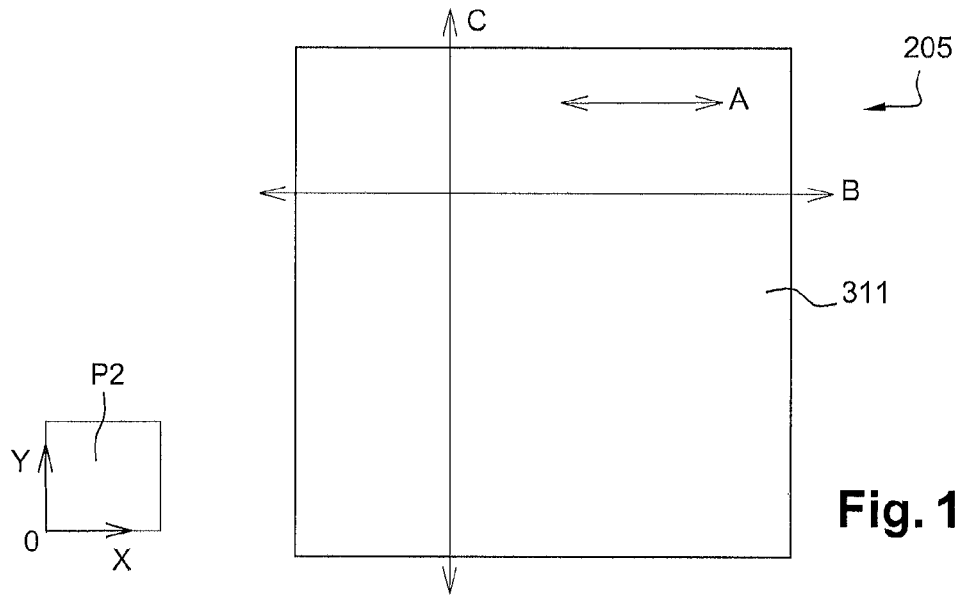
FIGS. 18a, 18b, 18c and 18d respectively show a top view and a first, second, and third sectional view of a fifth step in the method according to an embodiment of the invention.

FIG. 18a shows a top view along the second plane P2 of the device during the fifth step 205.

Figure 18B:
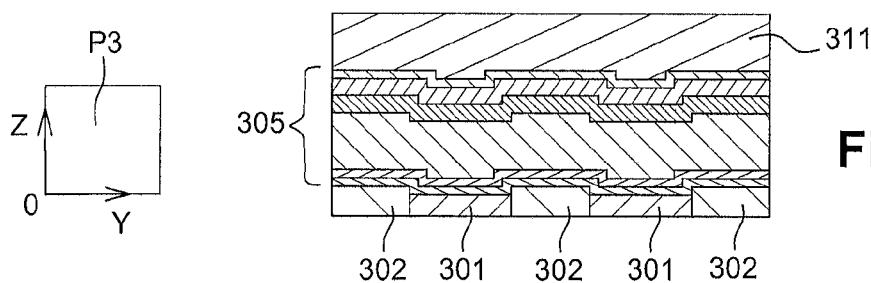
Figure 18C:
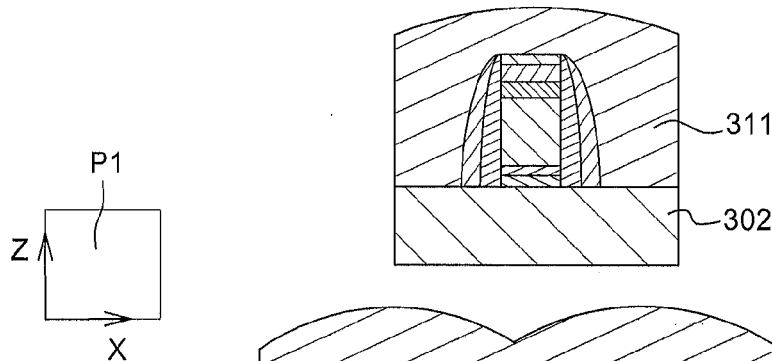

FIG. 18c is a sectional view along the first section plane A of the device during the fifth step 205.

Figure 18D:
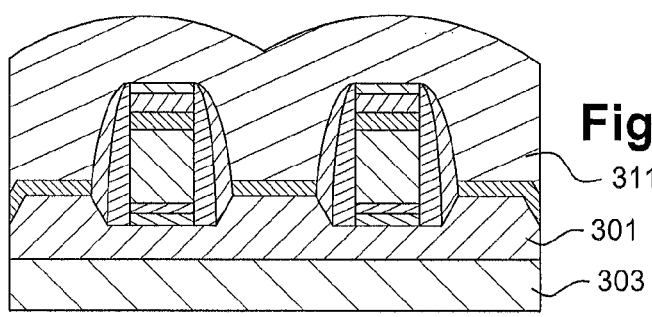

FIG. 18d is a sectional view along the second section plane B of the device during the fifth step 205.

FIG. 18b is a sectional view along the third section plane C of the device during the fifth step 205.

During the fifth step 205 the deposition of a layer 311 of a first level of dielectric, the "inter-layer dielectric" (ILD), is carried out on the device. The dielectric material used to form the layer 311 of the ILD first dielectric layer may be, for example, $SiO_2$.

A sixth step 206 in the method 200 is shown in FIGS. 19a, 19b, 19c and 19d.

Figure 19A:
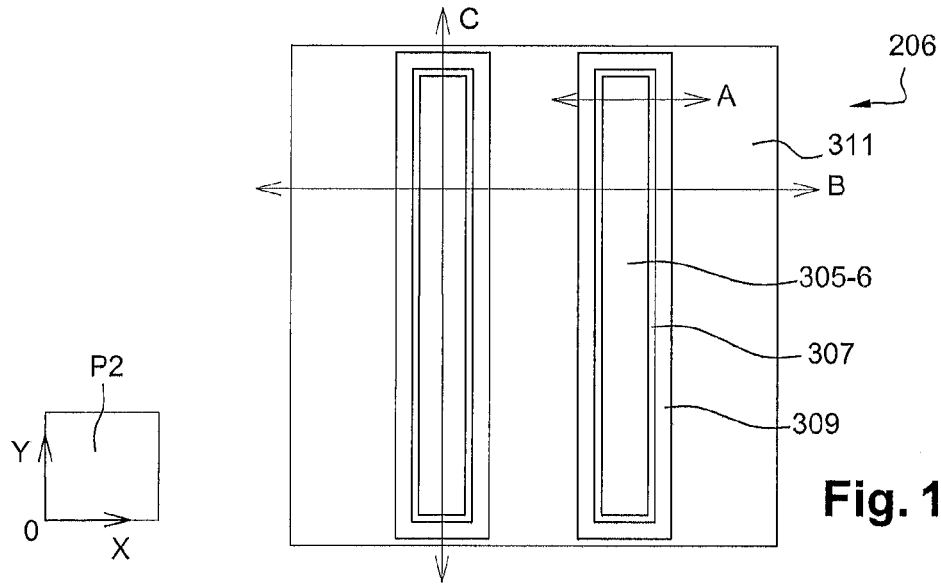
FIGS. 19a, 19b, 19c and 19d respectively show a top view and a first, second, and third sectional view of a sixth step in the method according to an embodiment of the invention.

FIG. 19a shows a top view along the second plane P2 of the device during the sixth step 206.

Figure 19B:
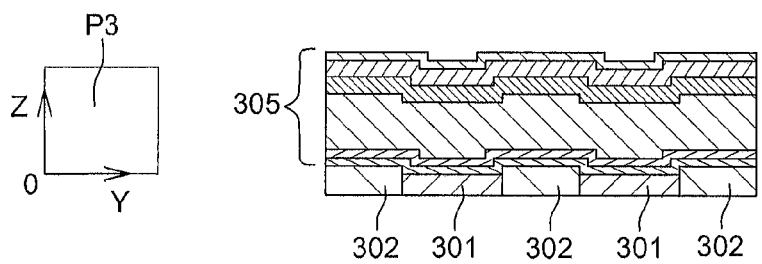
Figure 19C:
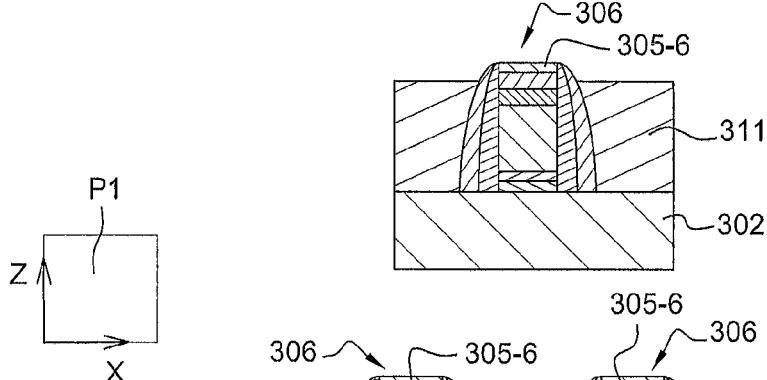

FIG. 19c is a sectional view along the first section plane A of the device during the sixth step 206.

Figure 19D:
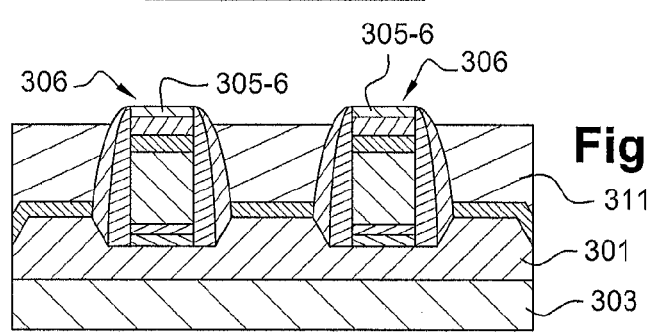

FIG. 19d is a sectional view along the second section plane B of the device during the sixth step 206.

FIG. 19b is a sectional view along the third section plane C of the device during the sixth step 206.

During the sixth step 206, the layer 311 of the ILD first dielectric layer previously deposited in the fifth step 205 is planarised. This planarisation is, in the example shown, carried out in two steps:

firstly a partial CMP chemical-mechanical polishing is carried out, at the end of which a portion of the thickness of the layer 311 of the first ILD dielectric level, measured along the Z axis, remains at the surface of the gate zones 306. The CMP chemical-mechanical polishing is therefore stopped a little before the upper surface of the gate zones 306;

then a finishing polishing step is carried out using an etchback method which ends up at the surface of the gate zones 306 in order to expose the sixth layer 305-6.

At the end of the sixth step 206, the space between the first insulating spacers 307 is completely filled by the layer 311 of the first ILD dielectric level.

A seventh step 207 in the method 200 is shown in FIGS. 20a, 20b, 20c and 20d.

Figure 20A:
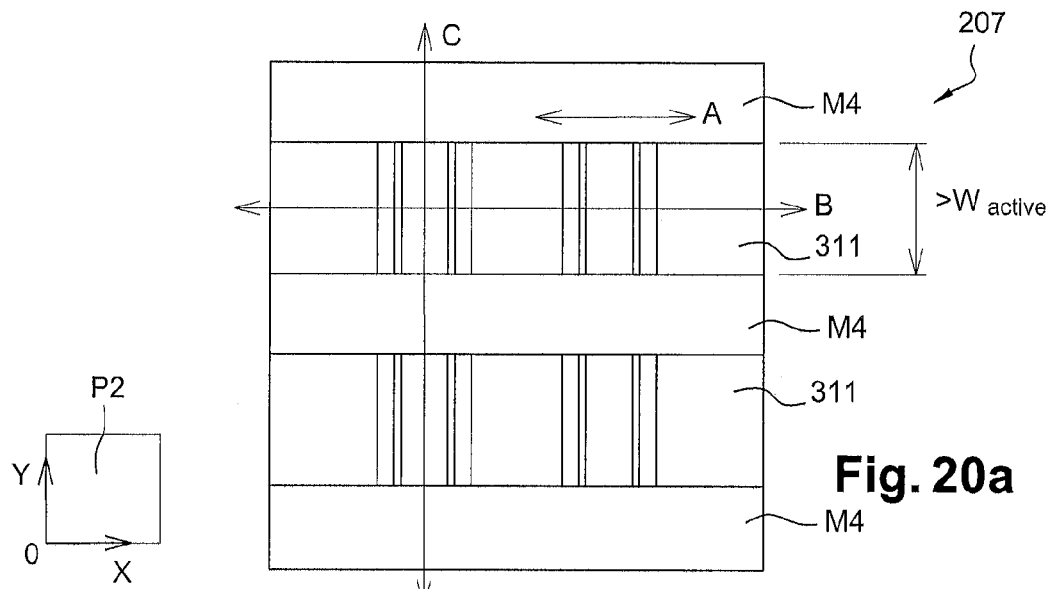
FIGS. 20a, 20b, 20c and 20d respectively show a top view and a first, second, and third sectional view of a seventh step in the method according to an embodiment of the invention.

FIG. 20a shows a top view along the second plane P2 of the device during the seventh step 207.

Figure 20B:
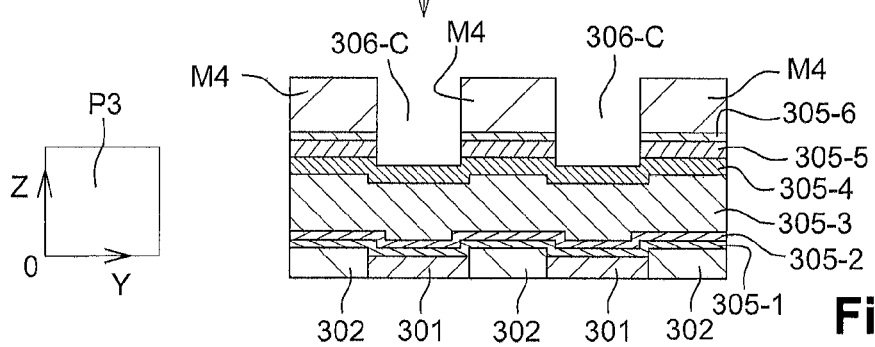
Figure 20C:
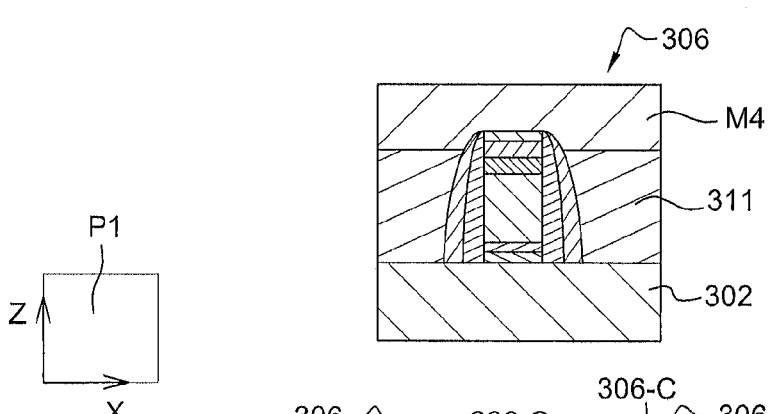

FIG. 20c is a sectional view along the first section plane A of the device during the seventh step 207.

Figure 20D:
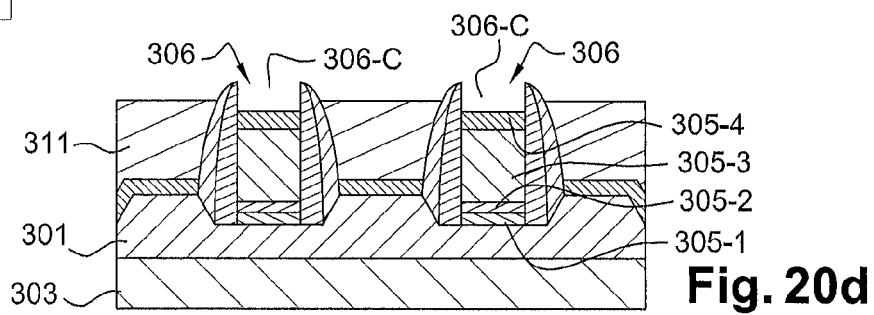

FIG. 20d is a sectional view along the second section plane B of the device during the seventh step 207.

FIG. 20b is a sectional view along the third section plane C of the device during the seventh step 207.

During the seventh step 207, a fourth mask M4 is made at each insulation zone 302, in order to protect the insulation zones 302. The distance measured, along the Y axis, between two masks M4 covering two consecutive insulation zones 302 is greater than the width $W_{active}$ of the active zones 301. Then the sixth layer 305-6 of the dielectric as well as the fifth layer 305-5 of the second metal is etched on the active zones 301 not protected by the fourth mask M4. Etching is then stopped on the fourth layer 305-4 of the first metal. The etching on the active zones 301 not protected by the fourth mask M4, of the sixth and fifth layers 305-6 and 305-5 results in a cavity 306-C appearing at the surface of each gate zone 306 on active zone 301, between the first insulating spacers 307. The gate zones 306 on insulation zone 302 are protected by the fourth mask M4 during the seventh step 207. The fourth mask M4 is then removed. The fact that the distance, measured along the Y axis, between two mask M4 covering two consecutive insulation zones 302 is greater than the width $W_{active}$ of the active zones 301 beneficially means that on the active zones the fifth layer 305-5 of the second metal is completely removed and that there is no residue.

It has been stated previously that the first metal of the fourth layer 305-4 is beneficially an alloy of titanium, an alloy of tungsten, an alloy of tantalum or an alloy of a metal and silicon. More generally any refractory metal is suitable for forming the fourth layer 305-4.

Similarly, it was indicated above that the second metal of the fifth layer 305-5 is beneficially an alloy of titanium, of tungsten or of tantalum. More generally, any refractory material which can be etched selectively, for example by plasma or wet etching, in relation to the first metal, to the layer 311 of the first layer of the ILD dielectric layer and to the materials of the first and second spacers 3074 and 309, beneficially with a selectivity ratio greater than 5:1 in relation to the first metal, is suitable for forming the fifth layer 305-5.

The term "refractory metal" refers to a metal capable of withstanding a thermal budget of the order of 1000° C., in particular during the creation of the source and drain zones 308, which usually involves an implantation step followed by a thermal annealing step.

The term "etching selectivity ratio greater than 5:1" means that during a given etching step, the layer of second metal may be etched more than five times faster than the layer of first metal.

In this context, the first metal is beneficially different from the second metal; that is, the first metal and the second metal beneficially have a different chemical composition, in order to contribute to ensuring that good etching selectivity is achieved. It may be envisaged, however, without going beyond the scope of the invention, that the first metal and the second metal are one and the same material. In this case the fourth layer 305-4 and the fifth layer 305-5 now only form the same single layer. Stopping the etching of the fifth layer 305-5 should then be controlled in order not to consume the fourth layer 305-4.

An eighth step 208 in the method 200 is shown in FIGS. 21a, 21b, 21c and 21d.

Figure 21A:
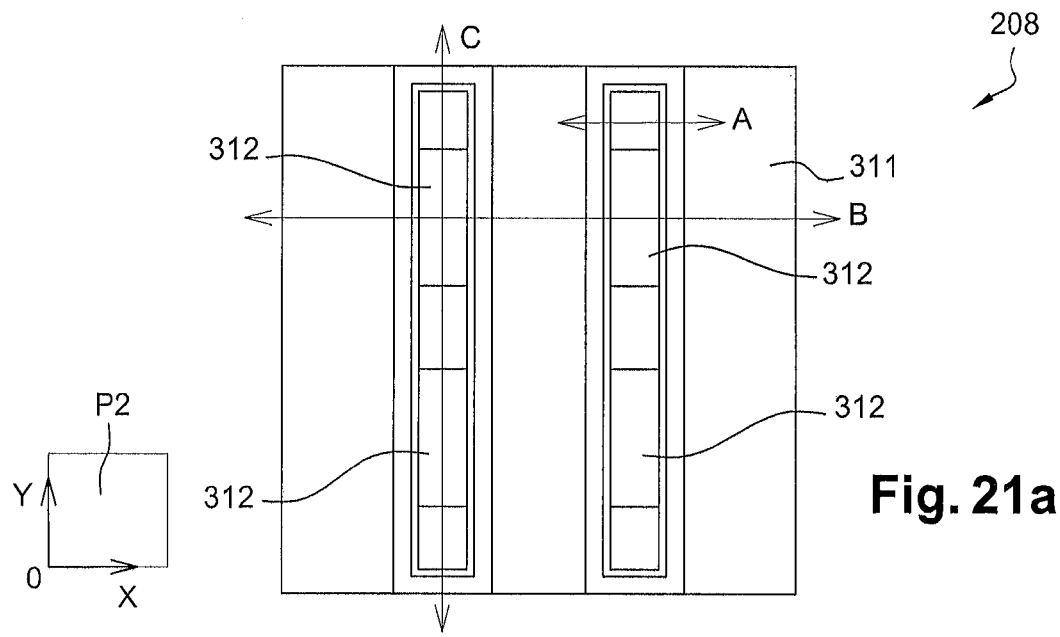
FIGS. 21a, 21b, 21c and 21d respectively show a top view and a first, second, and third sectional view of an eighth step in the method according to an embodiment of the invention.

FIG. 21a shows a top view along the second plane P2 of the device during the eighth step 208.

Figure 21B:
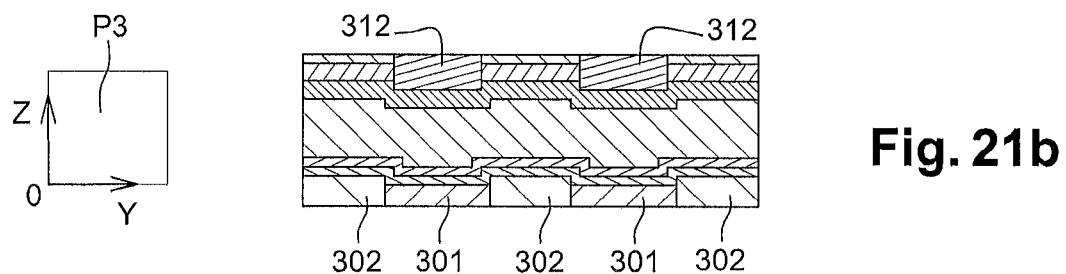
Figure 21C:
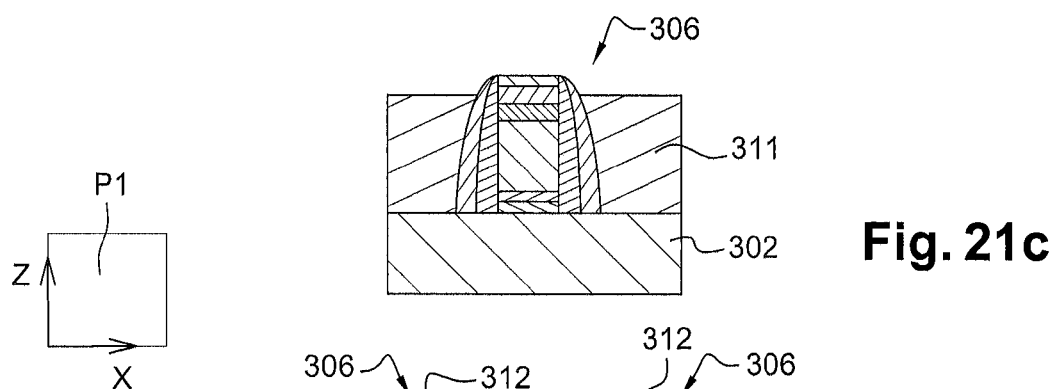

FIG. 21c is a sectional view along the first section plane A of the device during the eighth step 208.

Figure 21D:
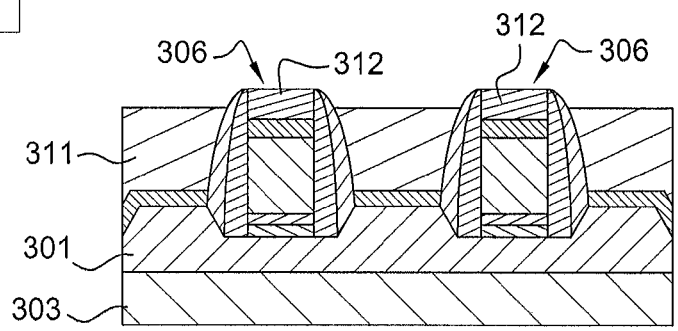

FIG. 21d is a sectional view along the second section plane B of the device during the eighth step 208, FIG. 21b is a sectional view along the third section plane C of the device during the eighth step 208.

During the eighth step 208 the deposition of a layer 312 of a dielectric, for example a silicon nitride SiN, is carried out over the entire device. The principal role of dielectric material deposited in the layer 312 is to insulate future self-aligned contacts in relation to the gate zones 306 on active zone 301. The dielectric material of layer 312 may in particular be SiN, BN or $HfO_2$, deposited using a technique for the deposition of thin atomic layers known as ALD ("Atomic Layer Deposition") or by a PEALD ("Plasma Enhanced Atomic Layer Deposition") technique. The layer of dielectric 312 is in particular deposited on each gate zone 306 on the active zone 301, in contact with the fourth layer 305-4 of the first metal previously exposed during the seventh step. CMP polishing of the layer 312 of dielectric is then carried out. At the end of this polishing step, the dielectric layer 312 is only preserved over the gate zones 306 on the active zone 301, thus forming a protective plug over each gate zone 306 on the active zone 301, which fills the cavities 306-C formed beforehand. These protective plugs contribute to preventing a short-circuit between the gate zones 306 on active zone 301 and source and drain contacts formed later and which are self-aligned with the gate zones 306 on the active zone 301. The protective plugs also contribute to reducing any parasitic capacitive coupling between the gate zones 306 on active zones 301 and the source and drain contacts.

At the end of the eighth step 208, each gate zone 306 on the active zone 301 thus comprises, in the example shown:

the first layer of dielectric 305-1;
the second layer of titanium nitride 305-2;
the third gate conductive layer 305-3;
the fourth layer 305-4 of first metal;
the protective plug 312 made of dielectric material.

A ninth step 209 in the method 200 is shown in FIGS. 22a, 22b, 22c and 22d.

Figure 22A:
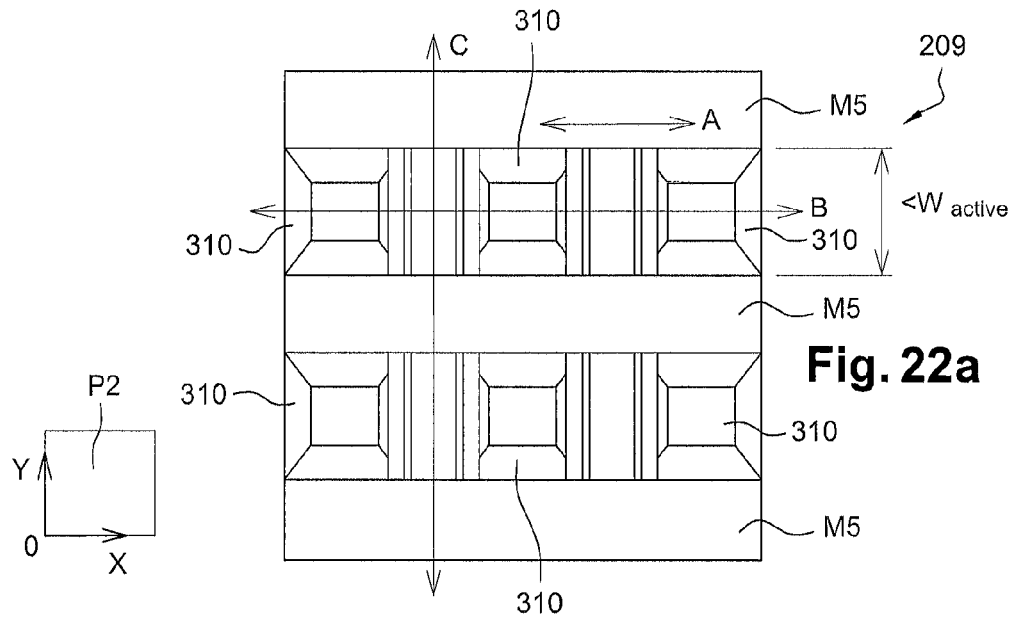
FIGS. 22a, 22b, 22c and 22d respectively show a top view and a first, second, and third sectional view of a ninth step in the method according to an embodiment of the invention.

FIG. 22a shows a top view along the second plane P2 of the device during the ninth step 209.

Figure 22B:
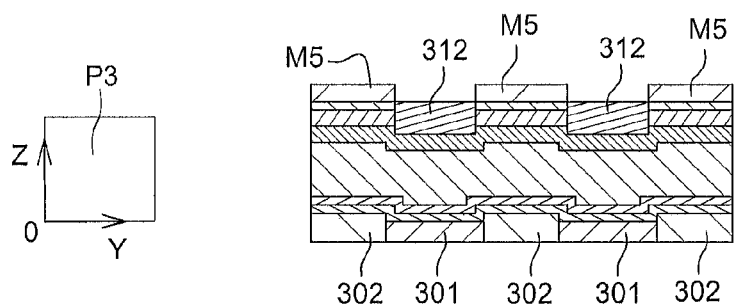
Figure 22C:
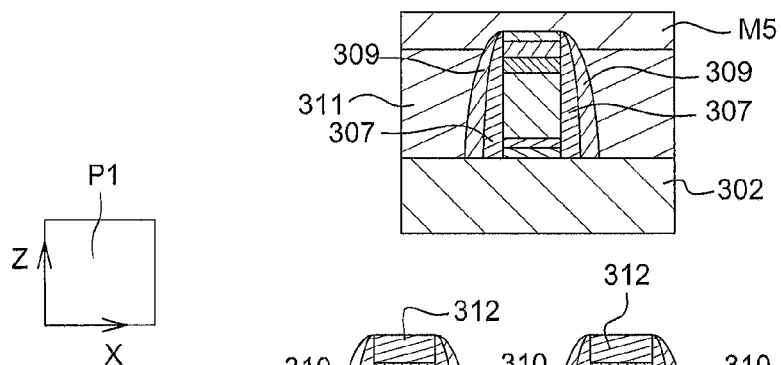

FIG. 22c is a sectional view along the first section plane A of the device during the ninth step 209.

Figure 22D:
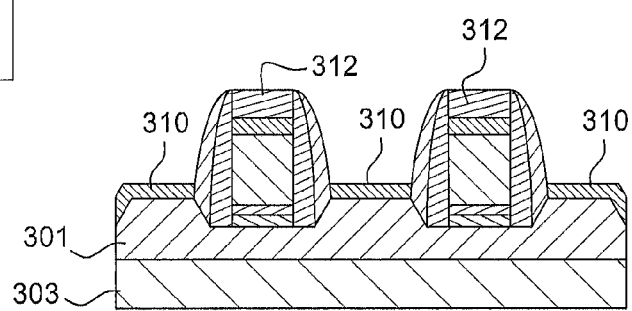

FIG. 22d is a sectional view along the second section plane B of the device during the ninth step 209.

FIG. 22b is a sectional view along the third section plane C of the device during the ninth step 209.

During the ninth step 209, a fifth mask M5 is made at each insulation zone 302, in order to protect the insulation zones 302. The distance, measured along the Y axis, between two masks M5 covering two consecutive insulation zones 302 is less than the width $W_{active}$ of the active zones 301. The fifth mask M5 is a hard mask, for example a hard mask made of nitride.

Then the layer 311 of the first ILD dielectric layer present on the active zones 301 and not protected by the fifth mask M5 is etched. This etching is carried out selectively in relation to the silicidation zones 310, the first spacers 307 and the second spacers 309, for example by plasma etching. At the end of the ninth step 209, the silicidation zones 310 are exposed. The first ILD dielectric level 311 present on the insulation zones 302 is protected by the fifth mask M5 and it is therefore preserved at the end of the ninth step 209. Then the fifth mask M5 is removed.

A tenth step 210 in the method 200 is shown in FIGS. 23a, 23b, 23c and 23d.

Figure 23A:
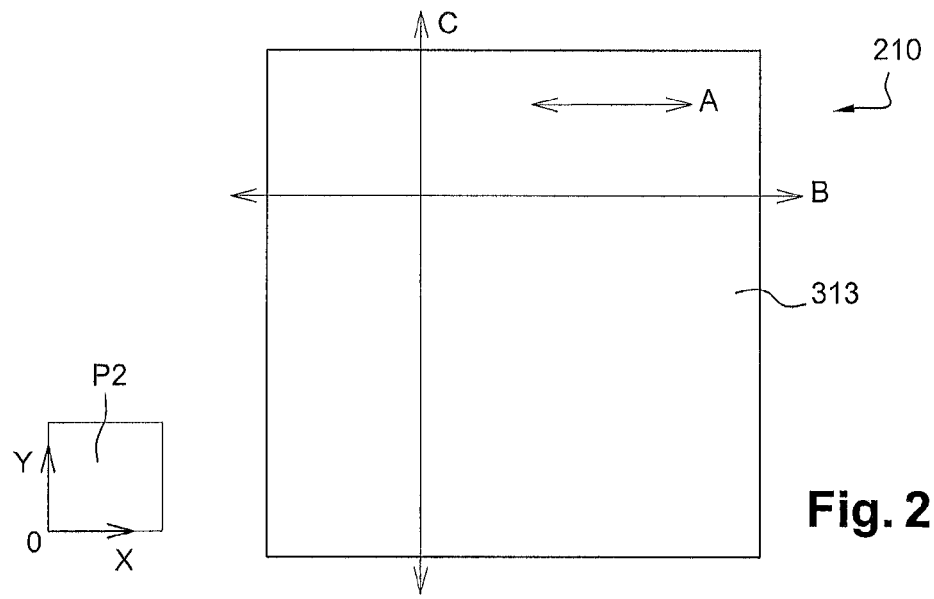
FIGS. 23a, 23b, 23c and 23d respectively show a top view and a first, second, and third sectional view of a tenth step in the method according to an embodiment of the invention.

FIG. 23a shows a top view along the second plane P2 of the device during the tenth step 210.

Figure 23B:
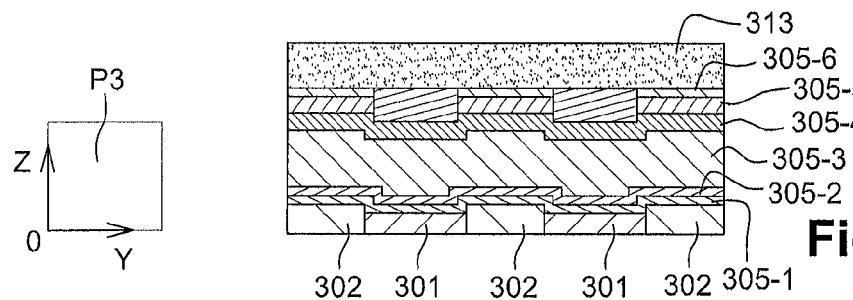
Figure 23C:
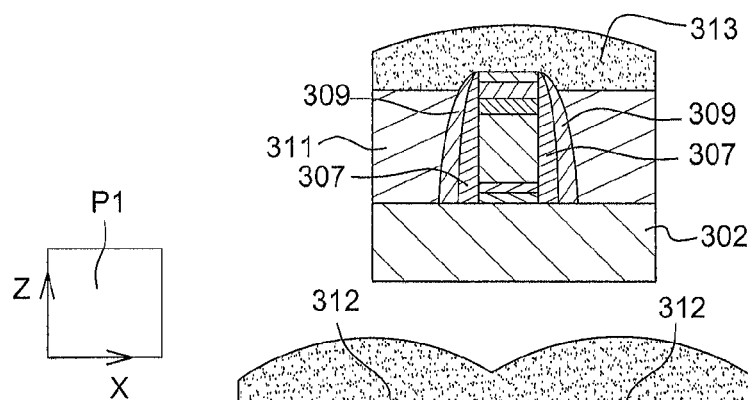

FIG. 23c is a sectional view along the first section plane A of the device during the tenth step 210.

Figure 23D:
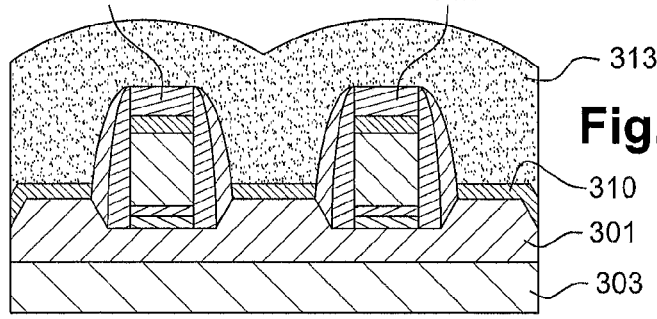

FIG. 23d is a sectional view along the second section plane B of the device during the tenth step 210.

FIG. 23b is a sectional view along the third section plane C of the device during the tenth step 210.

During the tenth step 210, deposition of a layer 313 of the constituent conductive material of future source and drain contacts is carried out. The first constituent material of the source and drain contacts may be any material usually used in the prior art to make source and drain contacts in transistors.

An eleventh step 211 in the method 200 is shown in FIGS. 24a, 24b, 24c and 24d.

FIG. 24a shows a top view along the second plane P2 of the device during the eleventh step 211.

FIG. 24c is a sectional view along the first section plane A of the device during the eleventh step 211.

FIG. 24d is a sectional view along the second section plane B of the device during the eleventh step 211.

FIG. 24b is a sectional view along the third section plane C of the device during the eleventh step 211

During the eleventh step 211, CMP polishing of the layer 313 of conductive material previously deposited in the tenth step 210 is carried out in order to break the circuit between the source and drain zones 308. At the end of the eleventh step 211, the conductive material is only preserved on the active zones 301 between the gate zones 306 on the active zone 301. There is no longer any conductive material 313 on the insulation zones 302.

The gate zones 306 on the active zones 301 comprise, at the end of the eleventh polishing step 211:
the first layer 305-1 of a high-k dielectric, which extends over the initial layer 300;
the second layer 305-2 of titanium nitride, which extends over the first layer 305-1;
the third layer 305-3 of polysilicon, which extends over the second layer 305-2;
the fourth layer 305-4 of the first metal which extends over the third layer 305-3;
the protective plug 312 made of dielectric material.

Each gate zone 306 on active zone 301 is thus protected by a protective plug 312 which extends over the fourth layer 305-4 of the first metal.

The first metal 305-4, which acts as silicide, therefore remains fully present on the active zones 301, despite the eleventh polishing step 211.

As for the gate zones 306 on the insulation zones 302, these comprise, at the end of the eleventh polishing step 211:
the first layer 305-1 of a high-k dielectric, which extends over the initial layer 300;
the second layer 305-2 of titanium nitride, which extends over the first layer 305-1;
the third layer 305-3 of polysilicon, which extends over the second layer 305-2;
the fourth layer 305-4 of the first metal which extends over the third layer 305-3;
the fifth layer 305-5 of the second metal which extends over the fourth layer 305-4;
the sixth layer 305-6 of dielectric, which extends over the fifth layer 305-5;

A twelfth step 212 in the method 200 is shown in FIGS. 25a, 25b, 25c and 25d.

Figure 25A:
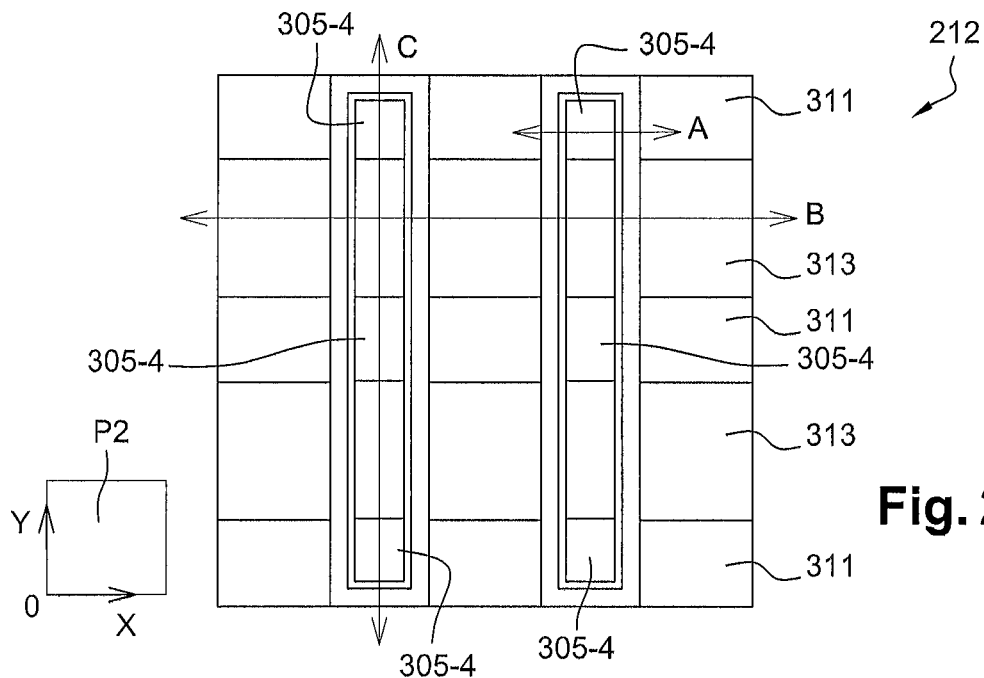
FIGS. 25a, 25b, 25c and 25d respectively show a top view and a first, second and third sectional view of a twelfth step in the method according to an embodiment of the invention.

FIG. 25a shows a top view along the second plane P2 of the device during the twelfth step 212.

Figure 25B:
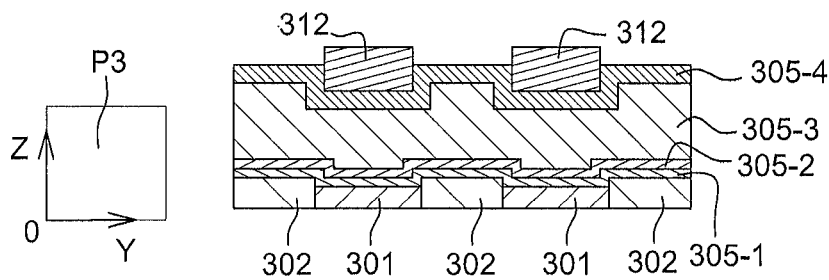
Figure 25C:
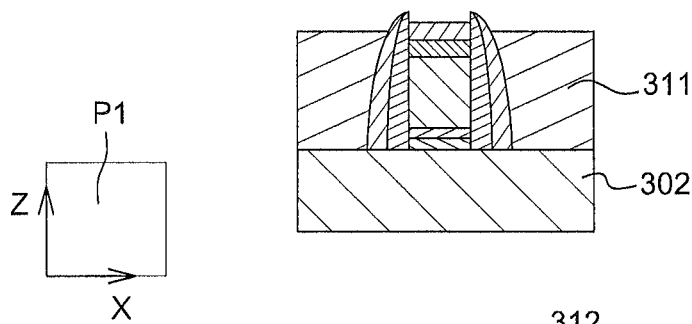

FIG. 25c is a sectional view along the first section plane A of the device during the twelfth step 212.

Figure 25D:
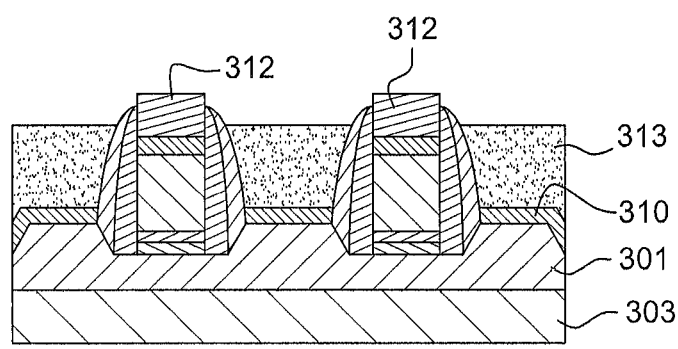

FIG. 25d is a sectional view along the second section plane B of the device during the twelfth step 212.

FIG. 25b is a sectional view along the third section plane C of the device during the twelfth step 212.

The following are removed during the twelfth step 212:
the sixth layer 305-6 of dielectric, which remained only on the insulation zones 302 at the end of the seventh step 207;
the fifth layer 305-5 of the second metal which also remained on the insulation zones 302.

The gate zones 306 on active zone 301 are protected during the twelfth step 212 by the nitride plugs 312.

A thirteenth step 213 in the method 200 is shown in FIGS. 26a, 26b, 26c and 26d.

Figure 26A:
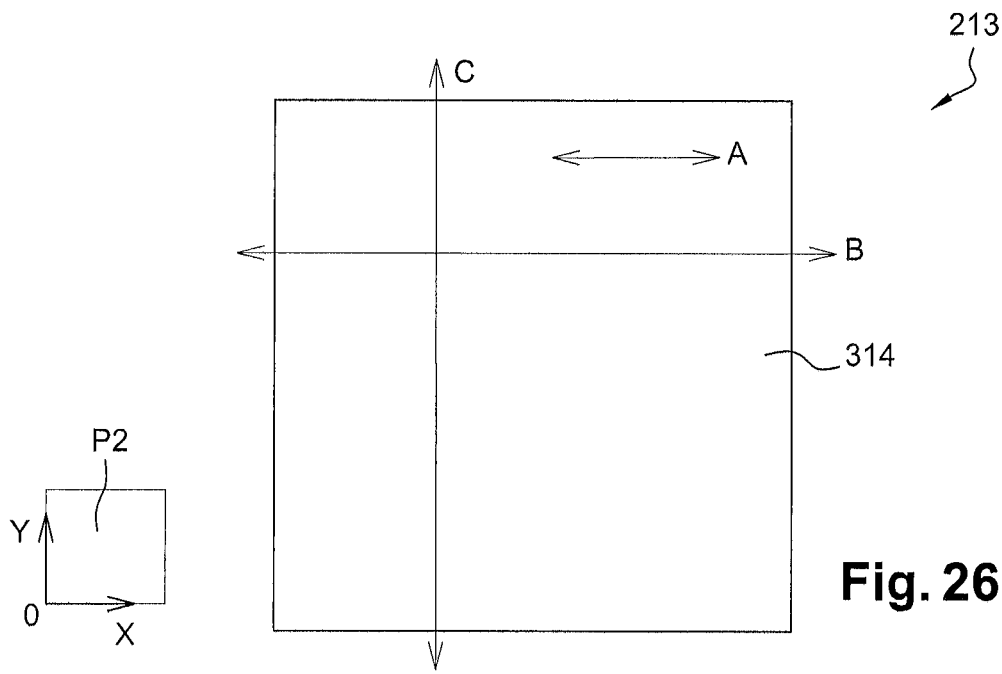
FIGS. 26a, 26b, 26c and 26d respectively show a top view and a first, second, and third sectional view of a thirteenth step in the method according to an embodiment of the invention.

FIG. 26a shows a top view along the second plane P2 of the device during the thirteenth step 213.

Figure 26B:
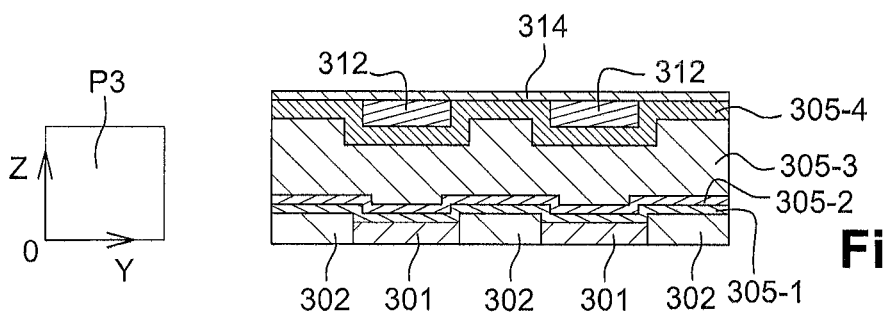
Figure 26C:
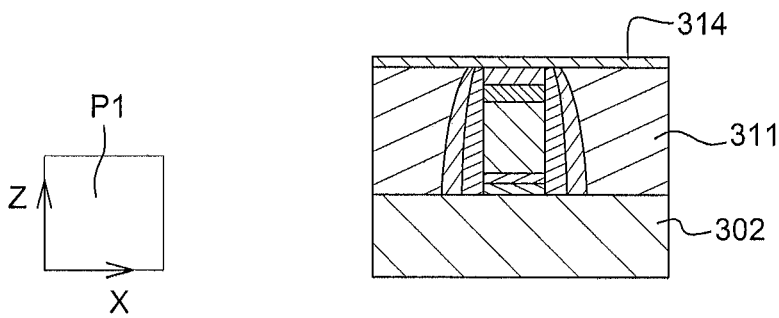

FIG. 26c is a sectional view along the first section plane A of the device during the thirteenth step 213.

Figure 26D:
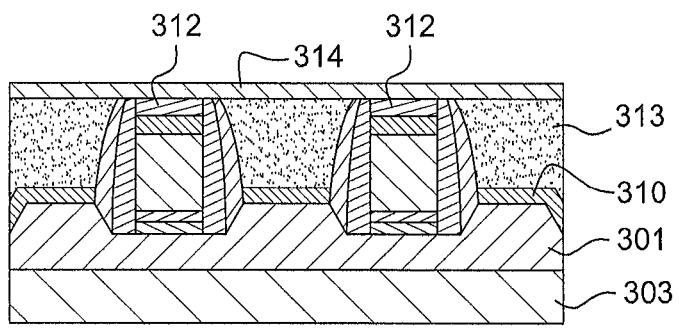

FIG. 26d is a sectional view along the second section plane B of the device during the thirteenth step 213.

FIG. 26b is a sectional view along the third section plane C of the device during the thirteenth step 213.

During the thirteenth step 213 the deposition of an etch stop layer (ESL) 314 is carried out. The layer 314 is, for example, a silicon nitride. A polishing step of the etch stop layer (ESL) 314 may be carried out, for example using a chemical-mechanical polishing step (CMP).

A fourteenth step 214 in the method 200 is shown in FIGS. 27a, 27b, 27c and 27d.

Figure 27A:
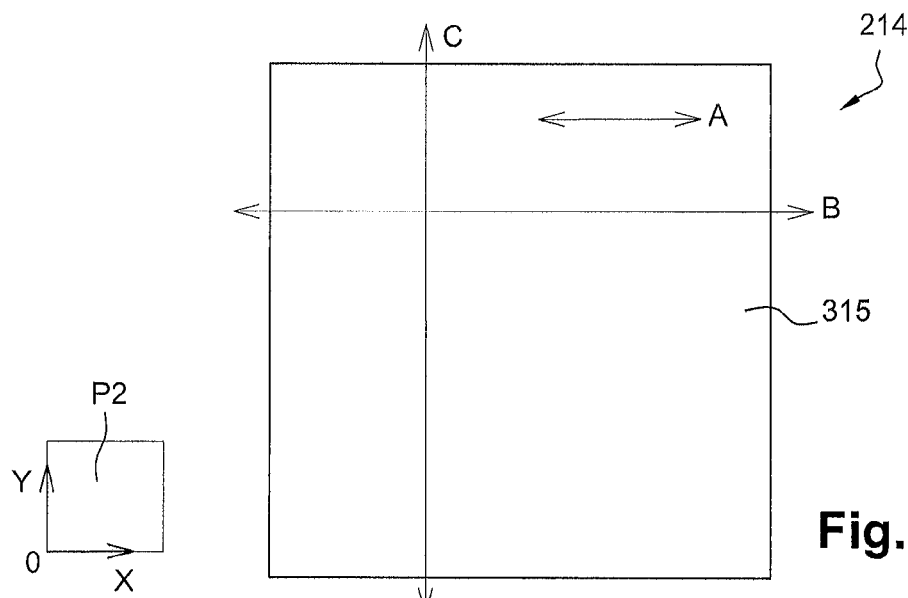
FIGS. 27a, 27b, 27c and 27d respectively show a top view and a first, second, and third sectional view of a fourteenth step in the method according to an embodiment of the invention.

FIG. 27a shows a top view along the second plane P2 of the device during the fourteenth step 214.

Figure 27B:
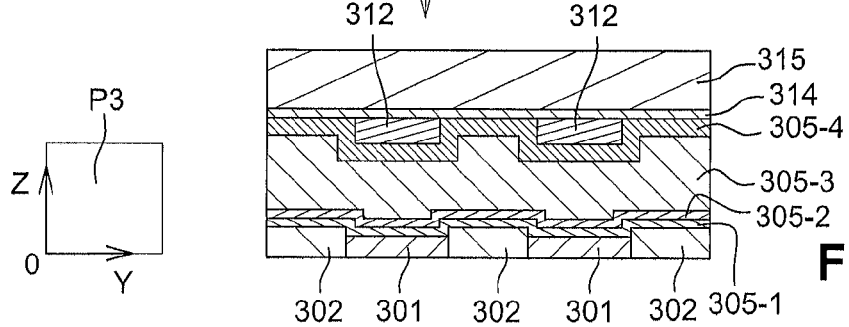
Figure 27C:
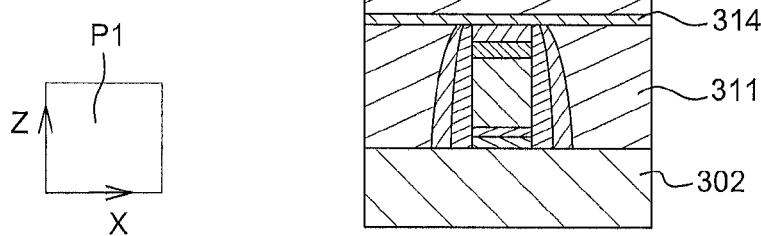

FIG. 27c is a sectional view along the first section plane A of the device during the fourteenth step 214.

Figure 27D:
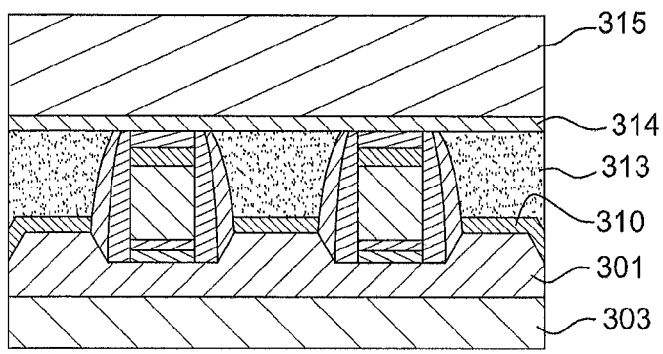

FIG. 27d is a sectional view along the second section plane B of the device during the fourteenth step 214.

FIG. 27b is a sectional view along the third section plane C of the device during the fourteenth step 214.

During the fourteenth step 214 the deposition of a layer 315 of a second level of ILD dielectric 315 is carried out.

A fifteenth step 215 in the method 200 is shown in FIGS. 28a, 28b, 28c and 28d.

Figure 28A:
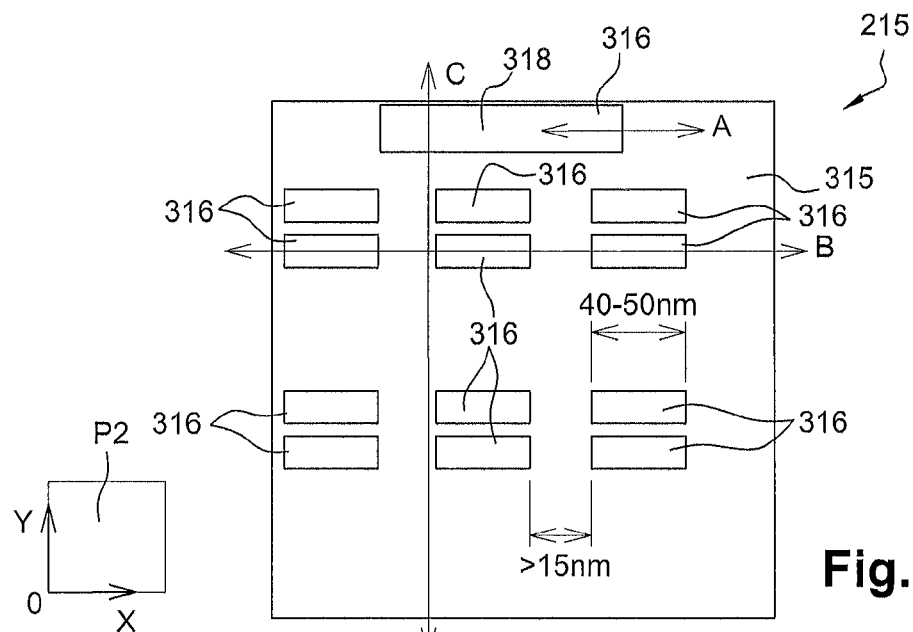
FIGS. 28a, 28b, 28c and 28d respectively show a top view and a first, second, and third sectional view of a fifteenth step in the method according to an embodiment of the invention.
Figure 29:
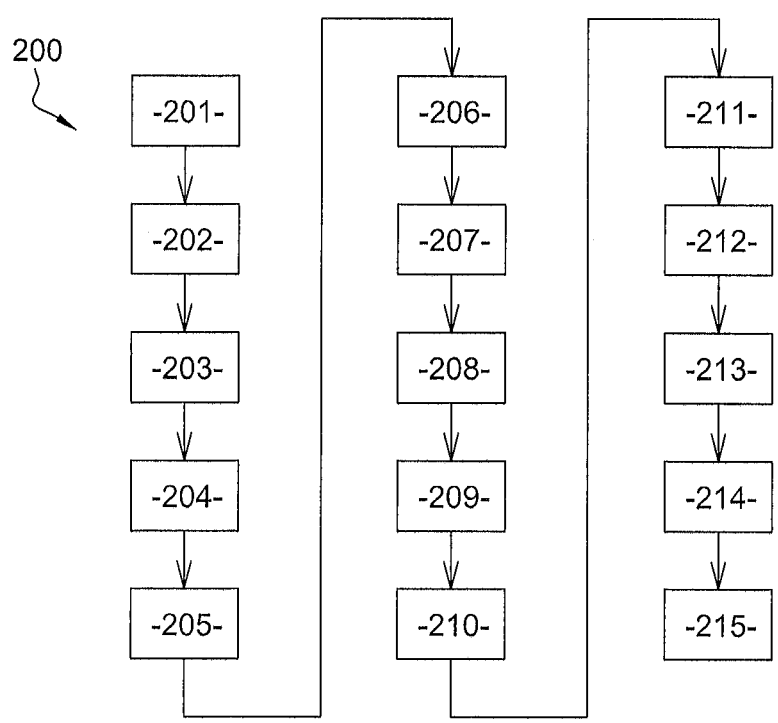
FIG. 29 is a diagram which schematically shows the organisation of the various steps in a method according to an embodiment of the invention.

FIG. 28a shows a top view along the second plane P2 of the device during the fifteenth step 215.

Figure 28B:
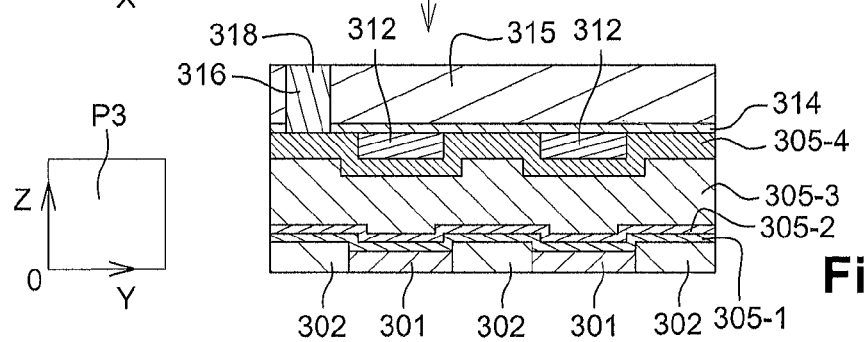
Figure 28C:
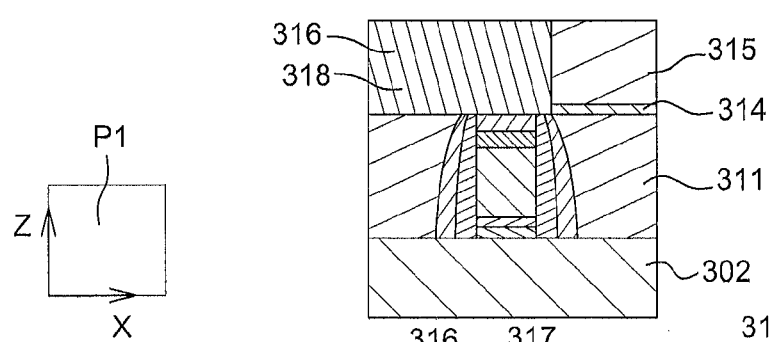

FIG. 28c is a sectional view along the first section plane A of the device during the fifteenth step 215.

Figure 28D:
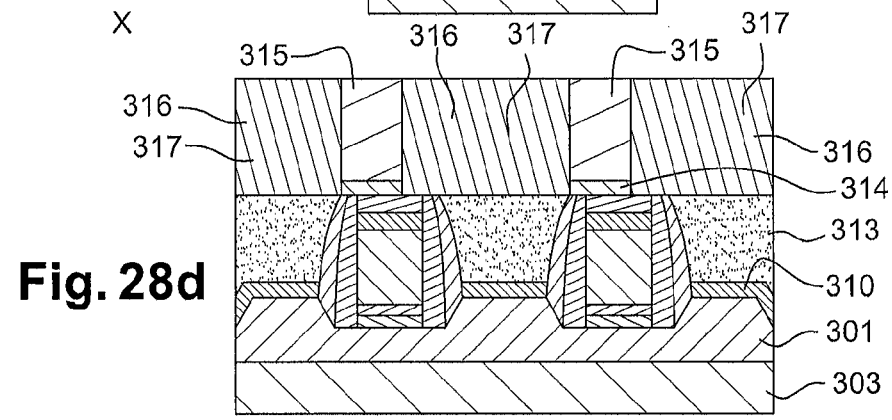

FIG. 28d is a sectional view along the second section plane B of the device during the fifteenth step 215.

FIG. 28b is a sectional view along the third section plane C of the device during the fifteenth step 215.

During the fifteenth step 215, a start is made by defining the contours of future source, drain and gate contacts, that is, the patterning of the contacts is carried out using lithography. Source and drain contacts 317 are to be located on active zone 301 on either side of the gate zones 306 on active zone 301. A gate contact 318 will be located on the insulation zone 302. Starting from the previously performed patterning, the levels of source and drain contact 317 and gate contacts 318 are then opened by an etching step on the layer 315 of the second ILD dielectric level and of the ESL stop layer 314. Then the deposition of a conductive material 316 in the previously defined contact levels is carried out.

At the end of this fifteenth step 215, for each gate zone 306 on active zone 301, source and drain contacts 317 which are self-aligned on the gate zone 306 on active zone 301 have therefore been made. It will be noted that a certain misalignment of the source and drain contacts 317 relative to each gate zone 306 on active zone 301 is possible, without adversely affecting the proper operation of the integrated circuit that is finally made, thanks to the presence of protective plugs 312 made of dielectric at the surface of the gate zones 306 on active zones 301. At the end of this fifteenth step 215 moreover, a gate contact 318 has been made on insulation zone 302. This gate contact 318 is in direct contact with the fifth layer 305-5 of the second metal of the gate zone 306 on insulation zone 302, with no need to carry out an etching step on an insulating layer.

Thanks to the fourth layer 305-4 of the first metal and to the fifth layer 305-5 of the second metal initially deposited in the gate stack 305, the method of an embodiment of the invention beneficially contributes towards a particular profile being obtained which allows the creation of a gate contact 308 function on insulation zone 302 and of gate zones 306 on active zones 301.

The fourth layer 305-4 of the gates zones 306 on active zones 301 has a coordinate Z1 along the Z axis. The lower level of the gate contacts 318 and source and drain contacts 317 have a coordinate Z2 along the Z axis. The method 200 according to an embodiment of the invention beneficially allows gate zones 306 to be made on active zones 310 whose fourth layer 305-4 of first metal, which is substantially parallel to the plane P2, is located below the lower level, also substantially parallel to the plane P2, the gate contacts 318 and source and drain contacts 317; that is to say Z1 is lower than Z2.

The invention claimed is:

1. A method for making an integrated circuit on a substrate, comprising:
    making a gate stack on a surface of an active zone, the making comprising:
        depositing a layer of first dielectric which extends over the active zone;
        depositing a gate conductive layer which extends over the layer of first dielectric;
        depositing a layer of a first metal which extends over the gate conductive layer;
        depositing a layer of a second metal which extends over the layer of the first metal;
        depositing a layer of a second dielectric which extends over the layer of the second metal;
    partially etching the gate stack for the formation of a gate zone on the active zone;
        making insulating spacers on either side of the gate zone on the active zone;
        making source and drain zones;
        making silicidation zones on a surface of the source and drain zones;
        etching, in the gate zone on the active zone, the second dielectric layer and the layer of second metal with stopping on the layer of the first metal, so as to form a cavity between the insulating spacers; and
        making a protective plug at a surface of the layer of first metal of the gate zone on the active zone, wherein the protective plug fills the cavity.

2. The method according to claim 1, wherein the layer of the first metal is a layer made of an alloy of refractory metal.

3. The method according to claim 2, wherein the layer of the first metal is a layer made of one of the following materials:
    an alloy of Titanium Ti;
    an alloy of Tungsten W;
    an alloy of Tantalum Ta;
    an alloy of a metal and silicon Si.

4. The method according to claim 1, wherein the layer of the second metal is a layer made of an alloy of refractory metal.

5. The method according to claim 4, wherein the layer of the second metal is a layer made of one of the following materials:
    an alloy of Titanium Ti;
    an alloy of Tungsten W;
    an alloy of Tantalum Ta.

6. The method according to claim 1, wherein the first metal in the layer of the first metal is different from the second metal in the layer of the second metal.

7. The method according to claim 6, wherein the layer of the second metal may be selectively etched in relation to the layer of the first metal.

8. The method according to claim 7, wherein the etching selectivity ratio between the layer of the second metal and the layer of the first metal is greater than 5:1.

9. The method according to claim 1, wherein the layer of the first metal has a thickness greater than or equal to 15 nm.

10. The method according to claim 1, wherein the layer of the second metal has a thickness of between 20 nm and 50 nm.

11. The method according to claim 1, wherein the gate conductive layer has a thickness greater than or equal to 15 nm.

12. The method according to claim 1, wherein a cumulative thickness of the gate conductive layer and of the layer of the first metal is less than or equal to 100 nm.

13. The method according to claim 1, comprising:
    depositing a conductive layer over the entire device; and
    polishing the conductive layer in order to break the circuit between the source and drain silicidation zones.

14. The method according to claim 13, comprising:
    depositing a stop layer over the entire device;
    depositing a layer of a dielectric on the stop layer;

selectively etching the layer of dielectric and the stop layer to expose the conductive layer, so as to cut trenches above the source and drain silicidation zones; and filling said trenches with a conductive material in order to make contacts on the source and drain silicidation zones.

15. The method according to claim 1, wherein the dielectric plug is made of a dielectric material including silicon nitride SiN, boron nitride BN or hafnium oxide $HfO_2$.

\* \* \* \* \*